(12) United States Patent
Guardiano et al.

(10) Patent No.: US 10,799,736 B2
(45) Date of Patent: Oct. 13, 2020

(54) STRUCTURALLY-INSTALLED ACCESS DEVICE FOR ACCEPTING CONNECTION BY A FIRE HOSE NOZZLE TO INTRODUCE FIREFIGHTING FLUID INTO AN ENCLOSED SPACE OF A STRUCTURE

(71) Applicant: GUARDIAN INVESTIGATION GROUP INC., Great Neck, NY (US)

(72) Inventors: Denis Guardiano, Brooklyn, NY (US); Donald Vastola, Rockville Center, NY (US); Eugene West, New Hyde Park, NY (US)

(73) Assignee: GUARDIAN INVESTIGATION GROUP INC., Great Neck, NY (US)

( * ) Notice: Subject to any disclaimer, the term of this patent is extended or adjusted under 35 U.S.C. 154(b) by 0 days.

(21) Appl. No.: 16/545,712

(22) Filed: Aug. 20, 2019

(65) Prior Publication Data
US 2019/0366137 A1    Dec. 5, 2019

Related U.S. Application Data

(60) Division of application No. 16/259,475, filed on Jan. 28, 2019, now Pat. No. 10,525,295, which is a
(Continued)

(51) Int. Cl.
*A62C 31/22* (2006.01)
*H01G 4/38* (2006.01)
(Continued)

(52) U.S. Cl.
CPC .............. *A62C 31/22* (2013.01); *A62C 33/04* (2013.01); *E06B 5/162* (2013.01); *F16L 5/04* (2013.01);
(Continued)

(58) Field of Classification Search
CPC ......... A62C 31/22; A62C 33/04; A62C 31/02; A62C 35/20; A62C 2/246; A62C 2/247;
(Continued)

(56) References Cited

U.S. PATENT DOCUMENTS

| 136,687 A | 3/1873 | Woodman |
| 635,601 A | 10/1899 | Schlosser |
(Continued)

FOREIGN PATENT DOCUMENTS

DE    202007015473    2/2008

OTHER PUBLICATIONS

Search Report dated Jun. 12, 2019 issued in European Patent Application No. 16849491.2.
(Continued)

*Primary Examiner* — Tuongminh N Pham
(74) *Attorney, Agent, or Firm* — Cozen O'Connor

(57) ABSTRACT

A nozzle access device is configured to be installed in a structural element and to accept connection by a fire hose nozzle to introduce firefighting fluid into an enclosed space. The device has a housing configured to be inserted in a hole formed in the structural element. The housing has a cylindrical body and a first face with an opening surrounded by an inwardly extending cylindrical socket. The housing has a second face, with an opening, which is attached to the cylindrical body. A movable nozzle connector in the housing has a connection portion configured to receive an inserted fire hose nozzle in a locking connection and a cylindrical nozzle stop portion extending from the connection portion. The nozzle stop portion is movably coupled within an interior of the socket of the first face.

9 Claims, 21 Drawing Sheets

Related U.S. Application Data continuation of application No. 15/446,757, filed as application No. PCT/US2016/052854 on Sep. 21, 2016, now Pat. No. 10,188,884.

(60) Provisional application No. 62/221,496, filed on Sep. 21, 2015.

(51) Int. Cl.

| | | |
|---|---|---|
| *A62C 33/04* | (2006.01) | |
| *E06B 5/16* | (2006.01) | |
| *F16L 5/04* | (2006.01) | |
| *H01G 4/012* | (2006.01) | |
| *H01G 4/12* | (2006.01) | |
| *H01G 4/232* | (2006.01) | |
| *H01G 4/30* | (2006.01) | |
| *H05K 1/18* | (2006.01) | |
| *A62C 31/02* | (2006.01) | |

(52) U.S. Cl.
CPC ........... *H01G 4/012* (2013.01); *H01G 4/1218* (2013.01); *H01G 4/232* (2013.01); *H01G 4/30* (2013.01); *H01G 4/38* (2013.01); *H05K 1/18* (2013.01); *A62C 31/02* (2013.01); *E06B 5/16* (2013.01); *H05K 2201/10015* (2013.01)

(58) Field of Classification Search
CPC .. A62C 2/248; A62C 2/24; A62C 2/06; E06B 5/162; E06B 5/16; H01G 4/012; H01G 4/1218; H01G 4/232; H01G 4/30; H01G 4/38; H05K 1/18; H05K 2201/10015; F16L 5/04
See application file for complete search history.

(56) References Cited

U.S. PATENT DOCUMENTS

| | | | |
|---|---|---|---|
| 765,760 | A | 7/1904 | Zetty |
| 1,051,220 | A | 1/1913 | De Grahl |
| 1,873,914 | A | 8/1932 | Adams |
| 2,157,643 | A | 5/1939 | Westwick |
| 2,807,479 | A * | 9/1957 | Hixon .................... A62C 35/20 169/70 |
| 2,926,658 | A | 3/1960 | Cleon |
| 3,561,725 | A | 2/1971 | Tones |
| 4,223,740 | A | 9/1980 | Clayton |
| 4,593,493 | A | 6/1986 | Naka et al. |
| 4,771,673 | A | 9/1988 | Miller |
| 5,116,086 | A * | 5/1992 | Psajd ..................... F16L 37/23 285/277 |
| 5,205,490 | A | 4/1993 | Steinhardt |
| 5,335,947 | A | 8/1994 | Remsburg |
| 5,433,383 | A | 7/1995 | Sundholm |
| 5,507,534 | A | 4/1996 | Reifenberger et al. |
| 6,386,194 | B1 | 5/2002 | Christman |
| 6,619,570 | B1 | 9/2003 | Ericksen et al. |
| 6,981,351 | B2 | 1/2006 | Degelsegger |
| 2006/0101721 | A1* | 5/2006 | Weik, III ................ A62C 2/24 52/1 |
| 2009/0092519 | A1 | 4/2009 | Stewart |
| 2016/0033202 | A1 | 2/2016 | Walla |

OTHER PUBLICATIONS

Notice of Allowance dated Aug. 14, 2020 issued in U.S. Appl. No. 16/929,845.

* cited by examiner

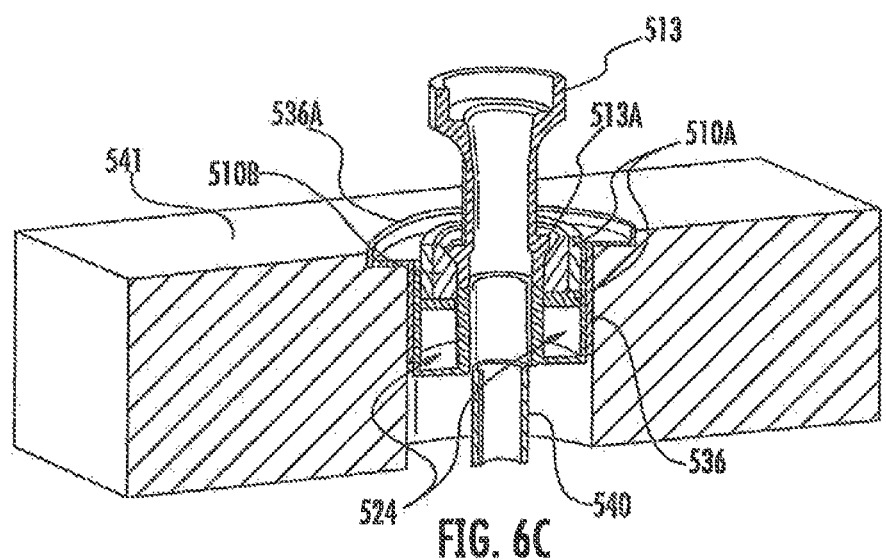

STRUCTURALLY-INSTALLED ACCESS DEVICE FOR ACCEPTING CONNECTION BY A FIRE HOSE NOZZLE TO INTRODUCE FIREFIGHTING FLUID INTO AN ENCLOSED SPACE OF A STRUCTURE

CROSS-REFERENCE TO RELATED APPLICATION

This application is a divisional of U.S. patent application Ser. No. 16/259,475, which was filed with the U.S. Patent and Trademark Office on Jan. 28, 2019, which is a continuation of U.S. patent application Ser. No. 15/446,757, which was filed with the U.S. Patent and Trademark Office on Mar. 1, 2017. This application claims priority to U.S. Provisional Patent Application No. 62/221,496, entitled "Coupling for Fire Hose," filed Sep. 21, 2015, which is incorporated herein by reference in its entirety.

FIELD OF THE INVENTION

The present invention relates to a coupling device for a fire hose nozzle to enhance protection of life in fire situations, and more specifically provides an expeditious and easy to use tool for firefighters while fighting a fire.

BACKGROUND OF THE INVENTION

During the act of firefighting, firefighters commonly create a manmade opening into a compartmentalized area containing a fire. This can pose an extreme danger to both fire personnel and occupants who may be present in uninvolved areas. The responding firefighters are therefore faced with the dilemma of rapidly getting water on the fire, while maintaining the integrity of the entrance door or other opening through which they apply their hose streams. The solution, in the form of a quick connect stream applicator or rapid placement stream applicator, is a component and tool that assists firefighters in applying water to fires burning within an enclosed area, space or room in a building, structure or vessel, including a subway or utility vault. As such, this device in all of its embodiments will be generally identified as Rapid Access Containment (RAC) devices. These RAC devices will allow the firefighters to apply water to the fire without the need to create a manmade opening.

Firefighting is a dangerous activity stemming partly from the unpredictable nature of the fire in general and the difficulty in many cases for the fire fighter to access the fire. A common technique in firefighting is to limit or cut off a supply of oxygen so that a fire can be contained and extinguished. Various techniques exist to accomplish this general goal, such as dousing a fire with oxygen—absorbing or limiting chemicals, or with water. When a fire occurs in an internal structure, such as a residential apartment, warehouse, high-rise building or the like, it is difficult in many instances to access a fire area with firefighting equipment while simultaneously limiting or avoiding the introduction of oxygen to the fire environment. It should be noted that fire conditions are significantly exacerbated when doors or windows are left open or fail, especially on upper floors of hi-rise buildings, resulting in what is commonly known as a "wind driven fire". This phenomenon causes the fire to quickly reach blowtorch proportions in the public hallways and stairways and has claimed the lives of numerous firefighters and civilians in recent years. Likewise, in the occurrence of an apartment fire, for example, the sudden introduction of a large supply of oxygen to a fire—which will occur when fire fighters open or force entry into an apartment via its entrance door to gain access to the fire with fire hoses—creating conditions for a phenomenon known as a "backdraft" which has threatened and taken the lives of many fire fighters over the years.

By definition, a backdraft is a phenomenon that can occur when an oxygen deficiency exists in a fire while the remaining combustible fuel gases are present at a temperature hotter than the ignition point of the fuel gases. If oxygen is re-introduced to the fire, combustion will restart, often explosively, as the gases are heated by the combustion and expand rapidly because of the rapidly increasing temperature condition occurring.

Accordingly, it is an object of the disclosed embodiments to provide a device that facilitates rapid access to a fire area by firefighters in order to introduce water to the fire so that it can be contained and extinguished without the introduction of additional oxygen into the fire area and thus limit to the greatest degree possible the adverse effects of any wind driven fire. At the same time the device will prohibit the spread of heat and fire gases into other occupied areas of the structure or building. As such, this device in all of its embodiments will be generally identified as Rapid Access Containment (RAC) devices.

SUMMARY OF THE INVENTION

In accordance with a first embodiment, formidable entrance doors (i.e., fire doors) providing access to an enclosed space within a building, structure or vessel will have a specialized device (a.k.a. a quick connect stream applicator) or Rapid Access Containment Device (i.e. RAC device-Door) built permanently into it for the purpose of directing a stream of water onto the fire without opening the door or creating another access point in the initial stages of the fire. In this first embodiment, the device can include a glass eyepiece viewer panel (peephole) for security purposes when installed in an entry door to a residence. Finally, in the first and other embodiments, the device can include a locking, flush mount, watertight cap instead of a glass viewer when exposed to the elements, which can be easily opened by fire personnel. In all of the embodiments described herein a tight seal is accomplished at the point of connection between the nozzle and the quick connect coupling. This is accomplished by means of a high heat resistant O-ring/seal made of a Perfluoroelastomer (FFKM) such as Kalrez, Markez or Chemraz This tight seal will facilitate ventilation of an involved area or space by attaching the nozzle and the uncharged length(s) of hose to any of the device applications and to then attach the female end of the hose to a vacuum or external exhaust thereby minimizing unnecessary exposure to smoke, chemical agents and any other airborne pathogens by those present therein. Similarly, in extreme cases where hostages are being held law enforcement can introduce a harmless sedating agent into the building or space in an effort to neutralize an ongoing threat posed by a hostage taker. These various access points into a building or space may also be used to the advantage of law enforcement to eavesdrop on conversations between the hostage taker and his victims or possibly provide a view of the suspect.

In a second embodiment, the device can be installed within a metal fireproof box in a wall that separates the public hall stairway from an interior hallway on any floor of a fireproof building (i.e. RAC device-Stairway). This embodiment will assist in maintaining the integrity of the public stairways under fire conditions, which are commonly known as fire towers in high-rise office or residential buildings. It will assist in affording safe egress for both firefighters and civilians to the greatest degree possible when descending the public hall stairways on those occasions when a fire exists on a lower floor. It will give firefighters an opportunity to greatly limit the amount of time that the door between the fire tower and the interior public hall on the fire floor is kept open thereby limiting the amount of heat and smoke that enters the fire tower. This embodiment will increase the survivability of anyone who may have entered the fire tower on any floor above the fire floor and yet afford firefighters the opportunity to commence fire operations. This device will assist in the evacuation of the "attack stairway" (i.e. stairway wherein firefighters commence fire operations, stretch and operate their hose lines) while fire extinguishment is underway. This is especially important since it is virtually impossible for firefighters to ensure that the "attack stairway" is not chosen as a means of egress by people who may be several floors above the fire or may have already been overcome in the fire tower prior to their arrival.

A third embodiment is characterized in that the device can be installed in the roof with a threaded pipe extension and an attached stream director or distributor (i.e. RAC device-Roof). The purpose of this device is to assist firefighters in getting water on the fire as quickly as possible when the fire is burning in a concealed roof space commonly known as the cockloft (i.e. the space above the top floor ceiling and below the roof boards). A fire in this portion of a building creates enormous problems for firefighters since it often extends over several apartments or commercial occupancies, involves a great deal of combustible material in the form of readily ignitable wood framing and roofing material, and is extremely difficult to access for purposes of water application and extinguishment. Additionally, the task of cutting holes in the roof or pulling sections of ceiling down on the top floor to determine the boundaries of a fire of this type is extremely destructive, very time consuming, and difficult to accomplish. The embodiments will provide the following advantages: When properly spaced and installed in the roof, the devices will serve as a ready means to identify the boundaries of the fire while limiting the need for cutting examination holes in the roof. Once the direction of fire travel is determined and its boundaries identified, hose lines can be inserted into the embodiments at the appropriate locations in lieu of the fire department's routine trench cut (i.e. a large rectangular cut in the roof made by firefighters). In essence, this system would amount to a trench cut with the added protection of an intact roof structure, rather than a dangerous condition that is often created when an actual trench cut is made in the roof. Much time would be saved and property damage greatly reduced since water application into the cockloft would be almost immediate and in the specific area or section of the roof as required. This would prove most advantageous to stopping or greatly limiting the spread of the advancing fire. Because the roof device openings are relatively small (approximately 6 inches in diameter) there is less likelihood of pulling the fire into uninvolved areas of the cockloft, as is the case when a trench cut or large roof opening is made in the roof by firefighters. Since the device openings also serve as limited vent holes, the chances of a backdraft is reduced.

The disclosed devices allow the dissipation of heat and thus diminish the expansion of steel I-beams from the heat of the fire, which will increase the amount of time it takes for the collapse of the roof structure or the subsequent ignition of adjacent wood structural members. When a large fire occurs on an upper floor(s) of a high rise structure, people are often forced to seek refuge on the roof. This is especially problematic when the fire is outside the reach of conventional hose streams and people are precluded from descending the public hall stairs due to this lower floor fire. In such cases, if the device is installed in the roof of the high-rise, people can stretch the standpipe hose line located on the top floor in the fire tower(s) into one or more of these devices. This will increase their survival time on the roof, limit the production of heat at roof level, and facilitate the landing of a helicopter for rescue and removal of those trapped on the roof, when practical.

A fourth embodiment is characterized in that the device can be installed at street level above a subway platform or tunnel with a threaded pipe extension (i.e. RAC device-Subway). The purpose of this embodiment is to introduce a hose stream from street level into an underground space such as a subway in order to protect people that may be unable to evacuate due to a fire, explosion or chemical release. This type of situation will generally involve large numbers of people attempting to evacuate through limited emergency exits. This embodiment could also be used to introduce a fresh air supply from street level into the subway area similar to that used in mining accidents. This is especially important in recent years since there is an increased potential for terrorist activity with regard to explosives, anthrax, sarin gas and other chemicals. The combination of fresh air and the application of water streams from street level could save many lives. This device will provide a means by which lines of communication could be established from street level with those trapped in the subway and a means to obtain air samples, if necessary, in order to determine air quality and chemicals that may be present so first responders are adequately protected in order to accomplish their objective. This embodiment also facilitates ventilation of the subway and permits the introduction of small cameras to define the extent of the emergency.

A fifth embodiment is characterized in that the device can be installed in a wall or floor of a room, underground space, shaft or vessel (.e. RAC device-Confined Space). The purpose of this device is to introduce a hose stream from the exterior side of an enclosed room or space to contain and extinguish a fire burning therein, while affording those present in the structure, underground area, shaft or vessel an opportunity to reach safety. This type of situation will generally involve large numbers of people attempting to evacuate through limited emergency exits. This device could also be used to introduce a fresh air supply into a room or confined space within a structure, underground space, shaft or vessel. It is also a means by which air samples can be obtained, if necessary, to determine air quality and chemicals that may be present within this space so first responders are adequately protected to accomplish their objective. This device also facilitates ventilation of the involved area or space. This is possible since a tight seal is accomplished at the point of connection between the nozzle and the quick connect coupling in all of the embodiments by attaching the nozzle and the uncharged length(s) of hose to any of the device applications and to then attach the female end of the hose to a vacuum or external exhaust thereby minimizing unnecessary exposure to smoke, chemical agents and any other airborne pathogens by those present therein. Similarly, in extreme cases where hostages are being held law enforcement can introduce a harmless sedating agent into the building or space in an effort to neutralize an ongoing threat posed by a hostage taker. These various access points into a building or space may also be used to the advantage of law enforcement to eavesdrop on conversations between the hostage taker and his victims or possibly provide a view of the suspect.

In general, the number of devices required would be a function of the overall size of the enclosed area and the coverage being sought. The disclosed embodiments includes the following general characteristics: 1)quick connect/disconnect coupling permitting a fire hose nozzle to be connected directly to the device wherever it might be installed facilitating water application onto the fire; 2) a tilting mechanism so that a water stream can be accurately directed, and, optionally, 3) a heat sensor to detect conditions in the fire area prior to gaining entry. It is noted that in fire districts or municipalities where the nozzle tip of choice is not the main stream tip as described herein, the quick connect coupling may be omitted. In the absence of the quick connect coupling, any size hose nozzle can be inserted directly into the rapid placement stream applicator as noted in FIGS. 1E, 3D, 4C, 5C and 6C thus facilitating rapid water application onto the fire. The actual size of the nozzle tip used will determine its movement within the device and angle of resultant water stream. A permanently affixed heavy gauge, fire resistant rubber guide/stop is present within this rapid placement housing leaving a center opening adequate in diameter to accept fire nozzles up to three (3) inches in diameter so that a water stream can be accurately directed in each of embodiments described herein. The nozzle will rest on the high heat resistant rubber guide/stop and be in contact with it around its entire circumference permitting directional support, but in no way impede or hinder the quick removal of the nozzle, if necessary.

In one aspect, the disclosed embodiments provide a nozzle access device configured to be installed in a structural element defining, at least in part, an enclosed space. The nozzle access device is configured to accept connection by a fire hose nozzle to introduce firefighting fluid into the enclosed space. The nozzle access device includes a housing configured to be inserted in a hole formed in the structural element. The housing includes: a first face surrounded by a first flange and having an opening in a central portion thereof, the opening being surrounded by a cylindrical socket extending from the first face in a first direction; a cylindrical body portion extending from the first face in the first direction; and a second face surrounded by a second flange and having an opening in a central portion thereof, the second flange being configured to attach to an end of the body portion distal from the first face so that the first face, the second face, and the body portion define an interior of the housing. The housing further includes a movable nozzle connector disposed within the interior of the housing. The nozzle connector has a connection portion configured to receive an inserted fire hose nozzle in a locking connection, and a cylindrical nozzle stop portion extending from the connection portion, the nozzle stop portion being movably coupled within an interior of the socket of the first face.

Particular embodiments may include one or more of the following features.

The socket of the first face may have a concave interior surface and a distal end of the nozzle stop portion has a convex outer surface. The structural element may be a fire door. The nozzle stop portion may be configured to move rotatively and linearly within the interior of the socket of the first face. The nozzle access device may include a viewer panel attached to the first face of the housing and covering the opening in the first face, the viewer panel having a lens configured to provide a view from within the enclosed space of an exterior space on an exterior side of the structural element. The device may further include a one-way or mirrored viewer covering the opening in the second face of the housing.

The connection portion of the nozzle connector may include a seal configured to surround an end of an inserted nozzle. The connection portion of the nozzle connector may include at least one of locking pins, locking balls, and locking rings configured to engage behind a collar of an inserted nozzle to form the locking connection. The connection portion may include a spring release mechanism configured to release an inserted nozzle from the locking connection.

The device may further include a heat sensor configured to provide an indication on an exterior side of the structural element that a temperature within the enclosed space has exceeded a threshold. The indication may include an element that pops out of the heat sensor.

In another aspect, the disclosed embodiments provide a fire stairway access box configured to be installed in a structural element between a fire stairway and an interior hallway to introduce firefighting fluid into the interior hallway from the fire stairway. The access box includes: a first fireproof box configured to be inserted in an opening formed in the structural element from a stairway side, the first fireproof box having a hinged cover which opens into the stairway; and a second fireproof box configured to be inserted into the first fireproof box from a hallway side, the second fireproof box having a hinged cover which opens into the hallway. The second fireproof box includes a bracket attached to interior sides of the second fireproof box and a housing installed in the bracket. The housing includes: a first face surrounded by a first flange and having an opening in a central portion thereof, the opening being surrounded by a cylindrical socket extending from the first face in a first direction; a cylindrical body portion extending from the first face in the first direction; and a second face surrounded by a second flange and having an opening in a central portion thereof, the second flange extending from an end of the body portion distal from the first face so that the first face, the second face, and the body portion define an interior of the housing. The second fireproof box further includes a movable nozzle connector disposed within the interior of the housing. The nozzle connector has: a connection portion configured to receive an inserted fire hose nozzle in a locking connection; and a cylindrical nozzle stop portion extending from the connection portion, the nozzle stop portion being movably coupled within an interior of the socket of the first face.

Particular embodiments may include one or more of the following features.

The second fireproof box may further include an open portion configured to pass a fire hose from the stairway to the hallway. The second fireproof box may further include a fireproof blanket covering the open portion. The hinged cover of the second fireproof box may be configured to be opened by a release inside the second fireproof box. The access box may further include a heat sensor configured to provide an indication on a stairway side of the structural element that a temperature within the hallway has exceeded a threshold.

In another aspect, the disclosed embodiments provide a roof access unit configured to be installed in a roof of a structure to introduce firefighting fluid into an interior of the structure from the rooftop exterior. The access unit includes an outer housing configured to be inserted in an opening formed in the roof from an exterior side. The outer housing has: a bracket attached to an interior side of the outer housing and an inner housing installed in the bracket. The inner housing includes: a first face surrounded by a first flange and having an opening in a central portion thereof, the opening being surrounded by a cylindrical socket extending from the first face in a first direction; a cylindrical body portion extending from the first face in the first direction; and a second face surrounded by a second flange and having an opening in a central portion thereof, the second flange extending from an end of the body portion distal from the first face so that the first face, the second face, and the body portion define an interior of the inner housing. The outer housing further includes a movable nozzle connector disposed within the interior of the inner housing. The nozzle connector has: a connection portion configured to receive an inserted fire hose nozzle in a locking connection; and a cylindrical nozzle stop portion extending from the connection portion, the nozzle stop portion being movably coupled within an interior of the socket of the first face.

Particular embodiments may include one or more of the following features.

The bracket may include a threaded portion at a bottom end thereof for connecting an output pipe to the opening in the first face. The access unit may further include an output pipe installed in the threaded portion at the bottom end of the bracket and a stream director attached to a distal end of the output pipe and having a plurality of output orifices.

The above and other objects, effects features and advantages of the present invention will become more apparent from the following description of the embodiments thereof taken in conjunction with the accompanying drawings.

BRIEF DESCRIPTION OF DRAWINGS

FIGS. 1A-1E and 2 generally depict the installation of an access device in a door according to a first embodiment.

FIG. 1A is a cross sectional view showing the components of a quick connect stream applicator door device (side view) with a hose nozzle partially inserted in a straight (180 degree) position using locking pins, locking balls or locking rings.

FIG. 1B is a cross sectional view showing the components of a quick connect stream applicator door device (side view) with a hose nozzle attached in the straight (180 degree) position using locking pins, locking balls or locking rings.

FIG. 1C is a cross sectional view showing components of a quick connect stream applicator door device (side view) with a hose nozzle attached depicting degree of movement using locking pins, locking balls or locking rings.

FIG. 1D is a cross sectional view showing a quick connect stream applicator door device (side view) in the nested position using locking pins, locking balls or locking rings.

FIG. 1E is a cross sectional view of the rapid placement stream applicator and associated nozzle guide/stop (side view) within a door with a hose nozzle inserted using a high heat resistant rubber guide/stop.

FIG. 3A is a three dimensional view showing the exploded components of a quick connect stream applicator and hose roller (side view) within a stairway evacuation assist box using locking pins, locking balls or locking rings.

FIG. 3B is a cross sectional view showing the exploded components of a quick connect stream applicator (side view) within a stairway evacuation assist box using locking pins, locking balls or locking rings.

FIG. 3C is a three dimensional view showing the exploded components of a quick connect stream applicator with fireproof blanket and hose roller (side view) within a stairway evacuation assist box using locking pins, locking balls or locking rings.

FIG. 3D is a three-dimensional view showing the exploded components of the rapid placement stream applicator and associated nozzle guide/stop and hose roller, (side view) within a stairway evacuation assist box using a high heat resistant rubber guide/stop.

FIG. 4A is a three dimensional view showing the exploded components of a quick connect stream applicator for a roof application (side view) with nozzle and distributor attached using locking pins, locking balls or locking rings.

FIG. 4B is a cross sectional view showing the exploded components of a quick connect stream applicator (side view) for a roof application using locking pins, locking balls or locking rings.

FIG. 4C is a three dimensional view showing the exploded components of the rapid placement stream applicator and associated nozzle guide/stop for a roof application (side view) with nozzle and distributor attached using a high heat resistant rubber guide/stop.

FIG. 5A is a three dimensional view showing the components of a quick connect stream applicator for a subway or tunnel application with nozzle and threaded pipe extension attached using locking pins, locking balls or locking rings.

FIG. 5B is a cross sectional view showing the components of a quick connect stream applicator for a subway or tunnel application (side view) in the nested position using locking pins, locking balls or locking rings.

FIG. 5C is a three dimensional view showing the components of the rapid placement stream applicator and associated nozzle guide/stop for a subway or tunnel application with nozzle and threaded pipe extension attached using a high heat resistant rubber guide/stop.

FIGS. 6A-6C generally depicts the installation of quick connect stream applicator device in a wall or floor of a structure or vessel according to the fifth embodiment.

FIG. 6A is a three dimensional view showing the components of a quick connect stream applicator for a wall or floor application in a structure or vessel with nozzle and threaded pipe extension attached using locking pins, locking balls or locking rings.

FIG. 6B is a cross sectional view showing the components of a quick connect stream applicator for a wall or floor application in a structure or vessel (side view) in the nested position with stream director attached using locking pins, locking balls or locking rings.

FIG. 6C is a three dimensional view showing the components of the rapid placement stream applicator and associated nozzle guide/stop for a wall or floor application in a structure or vessel with nozzle and threaded pipe extension attached using a high heat resistant rubber guide/stop.

DETAILED DESCRIPTION

Figure 1A:
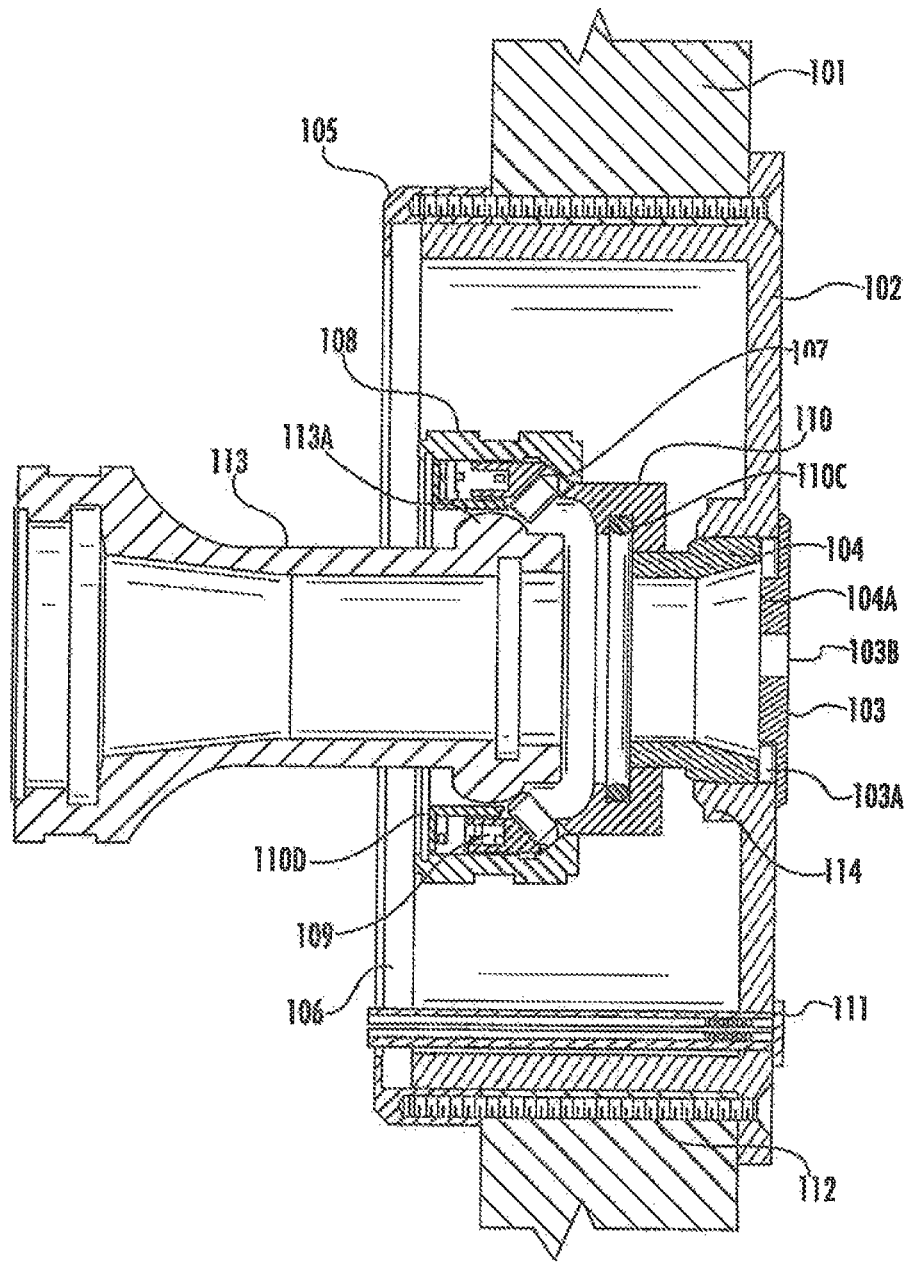

FIGS. 1A, 1B, 1C and 1D generally show a quick connect device 100 in accordance with an embodiment disposed in a door (i.e. RAC device-Door). The device 100 includes a housing containing side flange 102, an access cover, such as an eyepiece and glass viewer panel 103 with viewing glass 103B and viewing lens 103C and heat sensor 111 with an integral outside thread inserted from the interior occupancy side of the door 101 through a preferred pre-drilled hole, preferably about four (4) inches in diameter and extending through to the opposite hallway side of the door. The hole is preferably located in the center of the door approximately five (5) feet from the floor. It should be noted that the diameter of the hole and its height may be varied depending on the application and need. However, the size of the hole is preferred to be four (4) inches in diameter as to more easily accommodate a typical main stream nozzle tip while still allowing the device to slightly rotate within the housing as intended. The optional exterior decorative trim ring flange 105 (preferably brass finish) containing inside thread 105 with attached laminate convex one way glass or convex mirrored viewer 106 is then secured to the apartment side flange with outside thread 102 from an external side of the door, e.g., the hall side of the door, the hall side of the door by threading/turning clockwise, until it sits tight against the exterior of the door surface. This method of connecting exterior flange 105 to apartment side flange 102 will allow for installation of the device into doors with dimensions between 1 to 2 inches in thickness. It is noted that the trim may be constructed of any decorative metal such as nickel, stainless steel, chrome, or pewter with any finish desired, but brass is preferred in this embodiment based on both durability and aesthetic appeal.

The eyepiece and glass viewer panel 103 with viewing glass 103B and viewing lens 103C permits a panoramic view of the public hallway from inside the apartment when the device is not being used as a firefighting tool. This eyepiece and glass viewer panel 103 with viewing glass 103B and viewing lens 103C fits centrally into inside/apartment side housing flange 102. The apartment side flange and housing contains an outside thread that protrudes through and past the door outer surface approximately one half inch. It is noted that the actual protrusion depends on the thickness of the door or wall and the embodiment is not limited by the door thickness or the amount of protrusion. That is, the device will generally fit doors that range in thickness from 1 to 2 inches, but the application to door thicknesses may be varied to less than or greater than this range as desired. The protrusion readily permits attachment of the outer threaded brass trim ring 105 and attached laminate one way convex glass or convex glass mirrored viewer 106. It should be noted that the overall dimensions of this embodiment can be modified for either or both functionality and or aesthetics.

To install the device 100, the user/firefighter/professional inserts the entire housing 102 constructed of a fire resistant metal alloy and all attached components therein, which include items 102, 103, 103A, 103B, 103C, 104, 104A, 107, 108, 109, 110, 110C, 110D, 111, and 114 as shown in FIG. 1A-1E, into the preferably four (4) inch opening from the apartment side to mate with exterior flange 105 as noted above. A plurality of machine screws 112 are then inserted from the apartment side of the door into the door trim ring 105 and are tightened securely. It should be noted that in other embodiments the screws may not extend into the trim ring, but this is preferred to improve rigidity and durability.

Figure 1B:
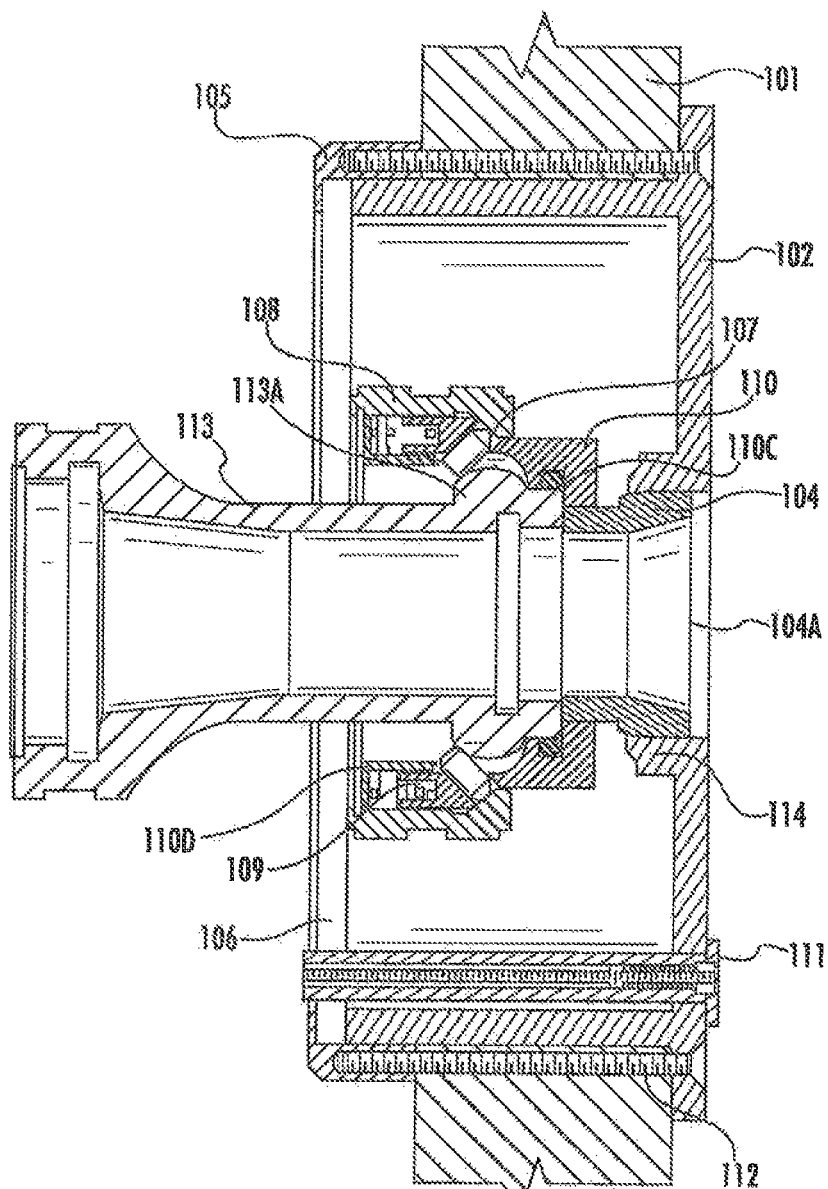
Figure 1C:
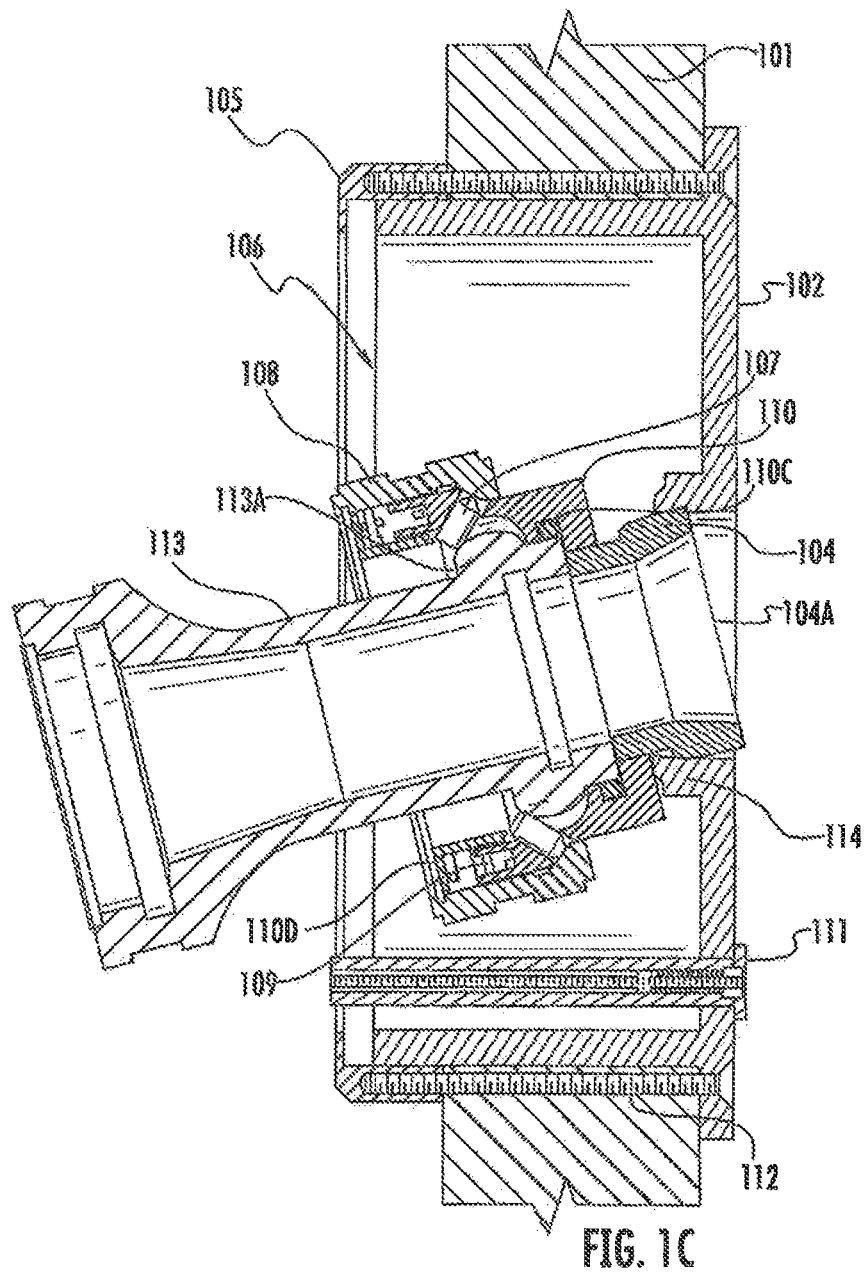
Figure 1D:
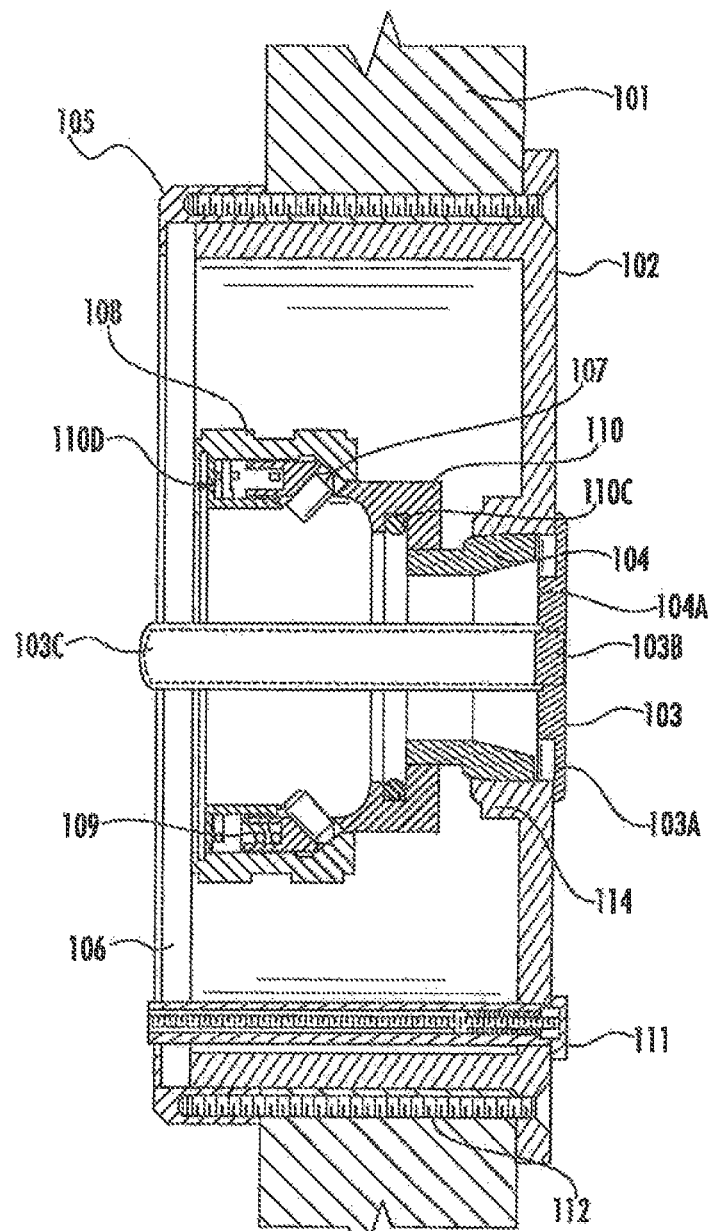

The operation of the device 100 will now be described in the event of a fire. Upon breaking the laminate one way convex glass or convex mirrored glass 106 on the hallway side of the entrance door, the firefighter inserts the main stream nozzle tip 113 from a fire hose into the door opening and pushes it against pivoting ball joint nozzle stop 104 causing a slight (e.g., 0.5 inch) forward movement of the pivoting nozzle stop striking, ejecting and breaking the eye piece and glass viewer panel 103 and its components on the inside/apartment side of the door. The main stream nozzle tip collar 113A will pass locking pins, locking balls or locking rings 107 and lock nozzle 113 in place. Once the decision to start water is made, the nozzle will be opened and the back pressure from the operation of the hose stream will cause the movable nozzle connection body guide/stop 110 and attached high heat resistant rubber seal 110C with inner slide sleeve 110D to be physically forced backward off the outer surface of inward socket guide/stop 114 permitting the forward nozzle stop bevel 104A to rest unimpeded on the inwardly rounded or slightly tapered edge of the inward socket guide/stop 114 allowing the connection to operate similar to that of a conventional ball and socket as seen in FIG. 1C. This movement permits a range of motion of the main stream tip and water stream to an angle of 12 degrees with respect to a longitudinal axis of the nozzle in all directions as the newly created connection is a pseudo ball and socket engagement. This angle, while relatively narrow at the door location, affords the firefighter substantial angular movement of the water stream within the room or occupancy on the opposite side of the door. It should be noted that the range of motion, or angle, is disclosed as approximately 12 degrees, but may be less than or greater than that as is desired. That is, a greater range of motion may be achieved by directly varying the size of the structure, individual components within the structure, and/or the attachment to or the means by which it is embedded in the specific embodiment herein disclosed.

During operation, the locking pins, locking balls or locking rings 107 will engage behind the main stream tip collar 113A securing the main stream-tip in place. Additionally, the spring release mechanism 108 with knurled locking collar is visible around the perimeter of the hole in the door on the hallway side. Once a decision is made to remove the main stream tip from the door and thus the quick connect stream applicator, the water supply is shut down. The firefighter will then depress the spring release mechanism 108 with knurled locking collar located on both sides of the main stream nozzle tip 113 from the hallway side with the thumb and index finger of one hand and push the locking collar 108 forward. This will permit the release of the locking pins, locking balls or locking rings 107 from the main stream tip collar 113A and the retraction of the main stream nozzle tip 113 from the door using the other hand.

It should be noted that, prior to breaking the glass and inserting the nozzle, the protruding shape of the laminate one way convex glass or convex mirrored glass viewer 106 on the hall side of the door permits the firefighter to simply slide his glove hand along the door when his vision is obscured due to fire conditions to identify the specific location for main stream nozzle tip 113 insertion. That is, in a heavy smoke condition a firefighter would simply slide his hand to the right of the laminate one way convex glass or convex mirrored glass viewer and feel for the protruding heat sensor 111 to confirm the correct location/apartment of the fire for hose stream application. In addition, if included, the heat sensor 111 will extend approximately 1 inch and glow red when temperatures within the apartment reach in excess of 150 degrees Fahrenheit or any other threshold temperature so desired. This will further assist firefighters in identifying the particular apartment where the fire is located.

Figure 2A:
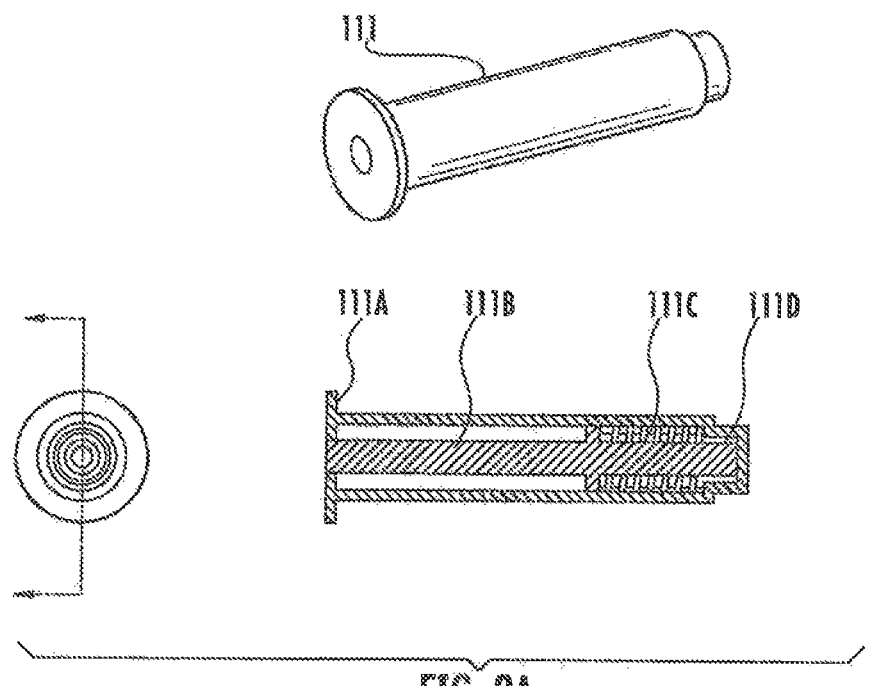
FIG. 2A is a cross sectional view of a heat sensor and its components for use with the quick connect applicator.
Figure 2B:
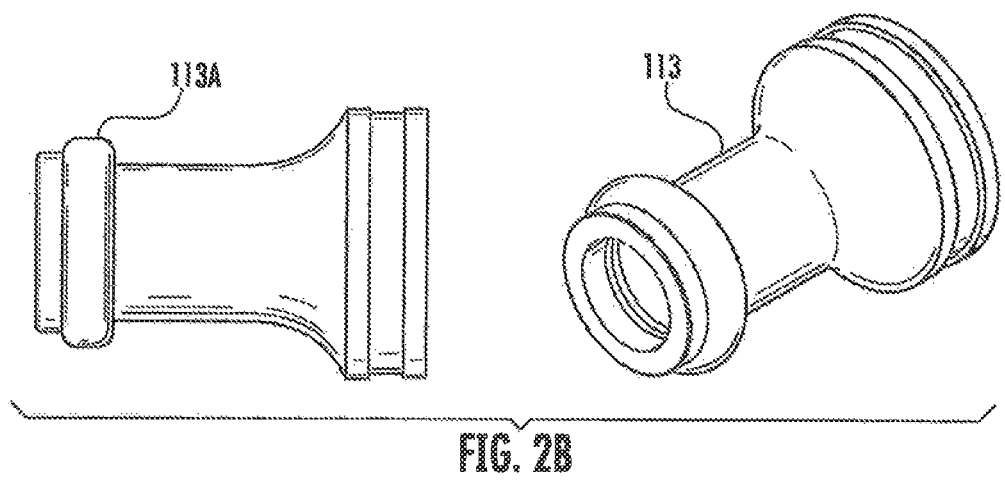
FIG. 2B is a plan view and an isometric view of the fire nozzle tip for use with the quick-connect applicator.

FIG. 2 shows the particulars of the heat sensor. Heat sensor 111 consists of an external metal housing 111A that is contained within the embodiment and an attached flange that will be seated on the surface of the hallway side of the door. Heat actuated center pin 111B will extend from a heat sensor by an amount to provide a visual indication of a heat condition, such as one inch and glow red when temperatures in excess of 150 degrees, or any other set threshold temperature, is reached on the interior side of the door. Expandable heating element 111C upon exposure to temperatures of 150 degrees or higher will push center pin 111B outward as described above. Item 111D is located at the tip of metal housing 111A and is constructed of a low melting metal alloy that when exposed to temperatures of 150 degrees or any other desired higher threshold temperature will melt thus permitting the expansion of heating element 111C and cause center pin 111B to pop out approximately one inch and glow red on the hallway side of the door. It is noted that the pop-out sensor length is not limited to one (1) inch and may be any length that is desired.

Figure 1E:
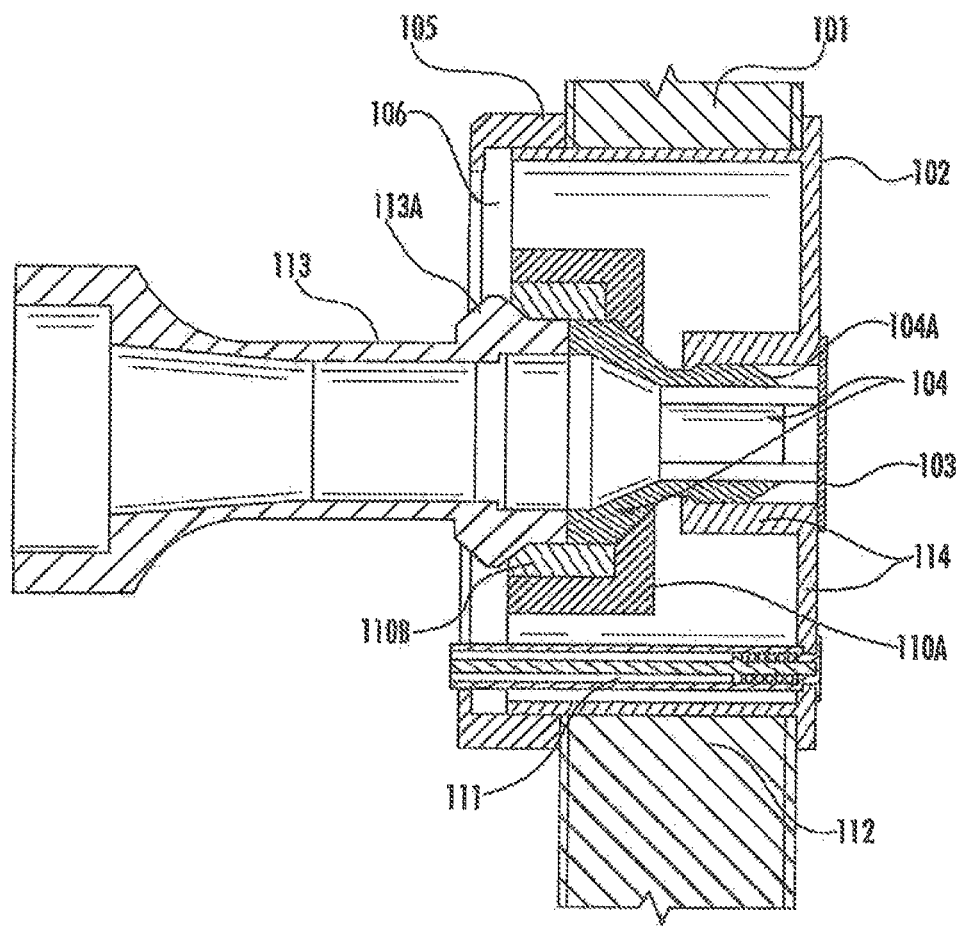

FIG. 1E generally shows the rapid placement stream applicator device 100 disposed in a door during use with a different construction as described above, namely, comprising a high heat resistant rubber guide/stop 110B instead of locking pins, locking balls or locking rings 107. The device of FIG. 1E consists of a cylindrical metal waterway with an outside thread constructed of a fire resistant metal alloy (i.e. stainless steel) and attached to an apartment side housing flange 102 also containing eyepiece and glass viewer panel 103 with viewing glass 103B and viewing lens 103C and heat sensor 111. The housing side flange 102, with its components, is inserted from the apartment side of the door 101 to be connected with exterior flange 105, through a preferred pre-drilled hole approximately 4 inches in diameter that is located in the center of the door approximately 5 feet from the floor. It should be noted that diameter of the hole and its height may be varied depending on the application and need. However, the size of the hole is preferred to be 4 inches as to accommodate a typical nozzle used by firefighters while permitting freedom of movement of such nozzle that the angle of the hose stream can be approximately 60 degrees above or below the horizontal in a 360 degree radius thus permitting the hose stream to be directed to the floor or ceiling within approximately 4 feet of the door in which it is operated. High heat resistant heavy gauge rubber guide/stop 110B, approximately 3 inches in diameter is inserted into the waterway and compressed against the apartment side flange 102 within the cavity of the door. This high heat resistant rubber guide/stop 110B will contain a center opening measuring approximately 2½ inches in diameter. The exterior decorative preferably brass trim ring 105 with attached laminate one way convex glass or convex glass mirrored viewer 106 is then secured to the apartment side flange 102 from the hallway side of the door such as by threading, until it sits tight against the exterior of the door surface and the high heat resistant rubber guide/stop 110B located within the internal waterway. It is noted that the trim may be constructed of any decorative metal of any finish desired, but brass is preferred in this embodiment.

The eyepiece and glass viewer panel 103 with viewing glass 103B and viewing lens 103C permits a panoramic view of the public hallway from inside the apartment when the device is not being used as a firefighting tool. This eye piece and glass viewer panel 103 with viewing glass 103B and viewing lens 103C is held in place with (4) spring plungers 103A equally spaced around the perimeter of the inside ring of the panel as seen in FIG. 1A. This eyepiece and glass viewer panel 103 with its components fits centrally into apartment side housing flange 102. The apartment side flange and internal housing contain an outside thread that protrudes through and past the door outer surface approximately ½ inch. It is noted that the actual protrusion depends on the thickness of the door or wall and the embodiment is not limited by the door thickness or the amount of protrusion. That is, the device will generally fit doors that range in thickness from 1 inch to 2 inches, but the application to door thicknesses may be varied to less than or greater than this range. The protrusion readily permits attachment of the outer threaded brass trim ring 105 and attached laminate one way convex glass or convex glass mirrored viewer 106.

To install the device of FIG. 1E, the entire housing 102 is inserted into the preferably 4 inch hole from the apartment side and connected to exterior flange 105 as noted above. Screws 112, or other fasteners, are then inserted from the apartment side of the door into the door trim ring 105 and are tightened securely. It should be noted that in other embodiments the screws may not extend into the trim ring, but is preferred to improve rigidity.

The operation of this embodiment will now be briefly described. Upon breaking this laminate one way convex glass or convex mirrored glass viewer 106 on the hallway side of the entrance door, the firefighter inserts the nozzle tip 113 into the door opening and pushes it through the center opening of the high heat resistant rubber guide/stop 110B located around the inside perimeter of the waterway resulting in the nozzle tip striking, ejecting and breaking the eye piece and glass viewer panel 103 with viewing glass 103B and viewing lens 103C on the inside/apartment side of the door. The nozzle will rest on the rubber guide and be in contact with it around its entire circumference permitting directional support, but in no way impede or hinder the quick removal of the nozzle, if necessary. Once the decision to start water is made, the nozzle will be opened and the stream directed to the limits described above. Once a decision is made to remove the nozzle, the water supply is shut down. The firefighter will simply retract the nozzle pulling it backward through the high heat resistant rubber guide/stop 110B. As in the above embodiment, it should be noted that, prior to breaking the glass and nozzle insertion, the protruding shape of the laminate one way convex glass or convex mirrored glass viewer 106 on the hall side of the door permits the firefighter to simply slide his glove hand along the door when his vision is obscured due to fire conditions to identify the specific location for nozzle tip 113 insertion. The heavy gauge high heat resistant rubber guide/stop 110B may be used instead of locking pins, locking balls or locking rings 107 to provide an accurate and durable fit/engagement with the nozzle 113.

Figure 3A:
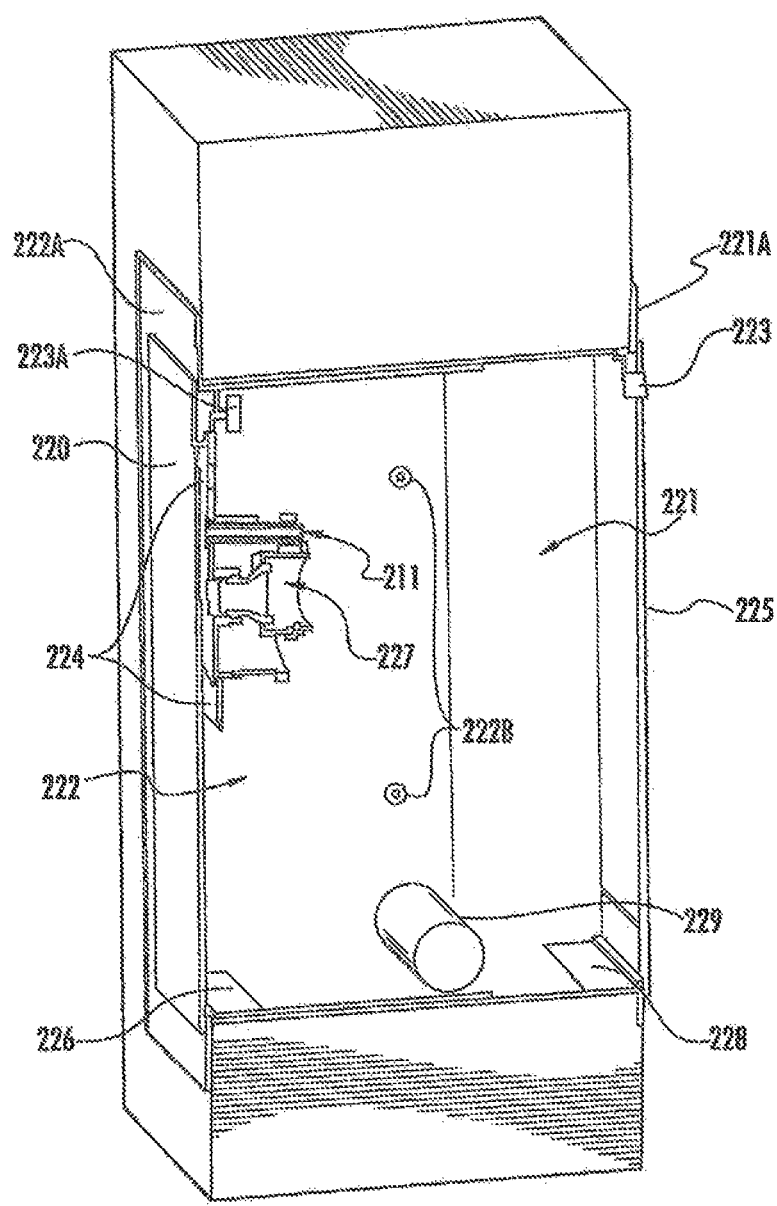
FIGS. 3A-3D generally depict the installation of this quick connect applicator in a cinder block wall within the stairway or fire tower of a fireproof building.
Figure 3B:
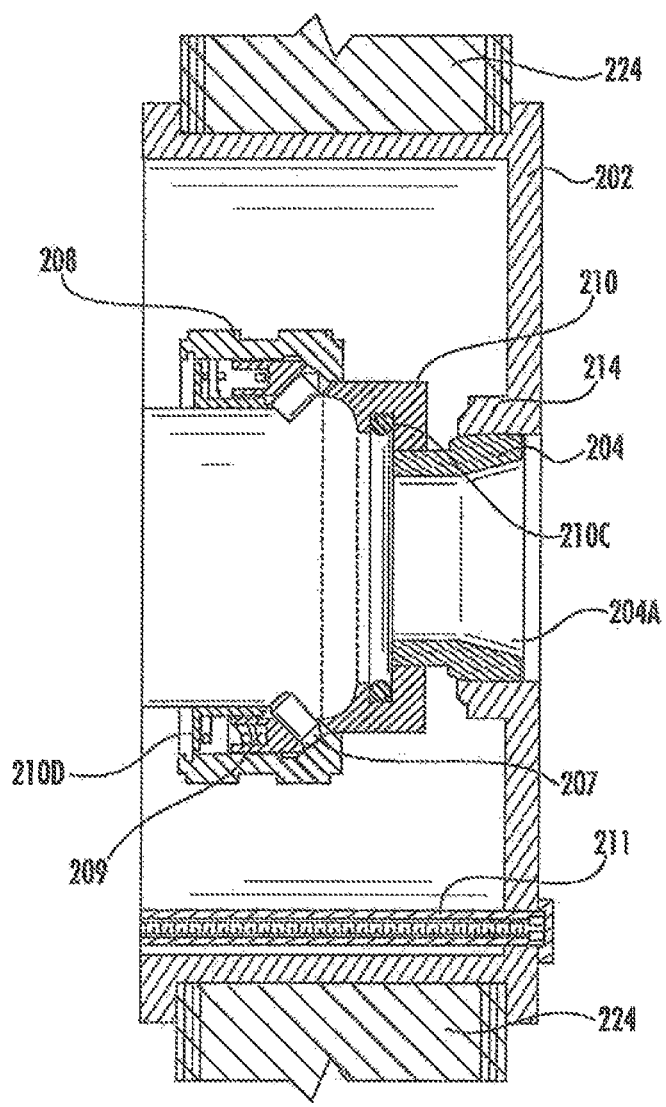
Figure 3C:
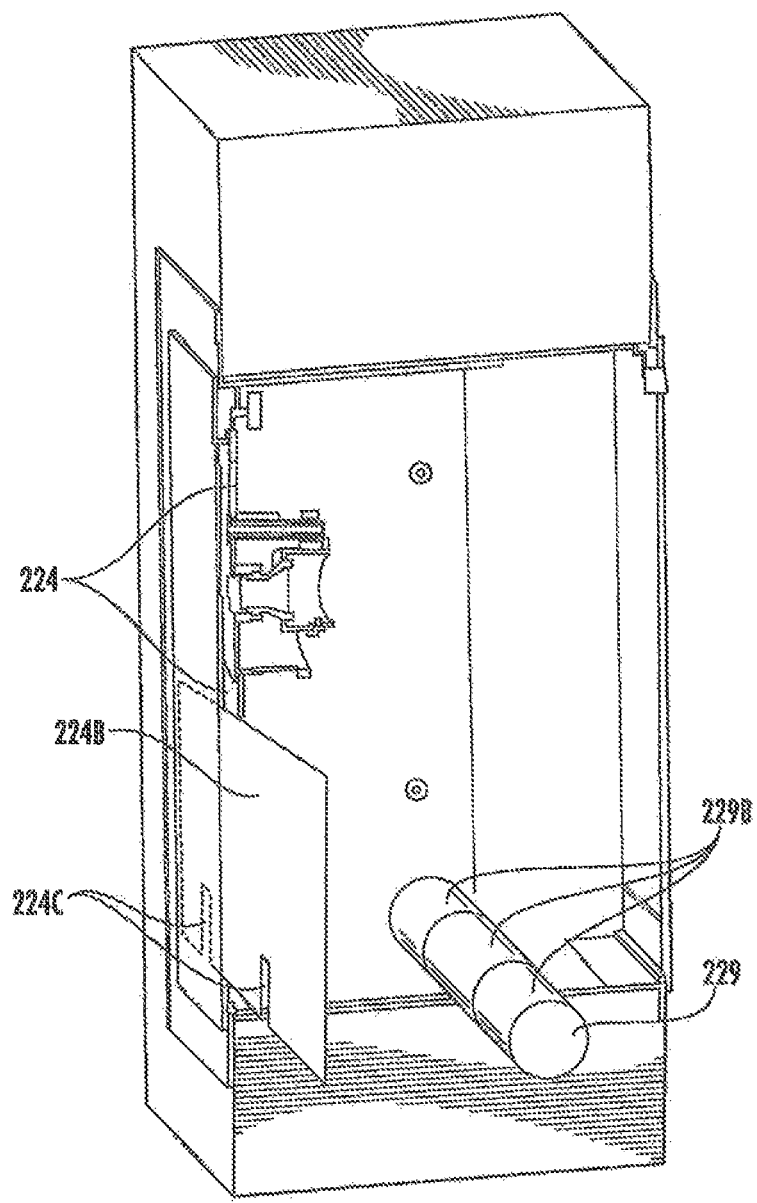

FIGS. 3A, 3B and 3C generally show device 227 disposed in a fire proof metal box, referred to herein as the second embodiment or stairway evacuation assist box embodiment (i.e. RAC device-Stairway). This embodiment consists of a preferred 12 inch by 18 inch by 6 inch rectangular metal fireproof box 221 into which a smaller metal box 222 is inserted and nested. These two metal box halves are then joined together at their sides with ½ inch machine screws 222B within a cinder block wall opening. It should be noted that the overall dimensions of this embodiment can be modified for either or both functionality and or aesthetics. During installation of the stairway device, metal hallway box 222 is inserted into the larger metal stairway box 221 and as the boxes slide directly into one another and overlap they can be adjusted to fit into walls with dimensions from 6 to 10 inches in thickness before being attached together with screws 222B. Furthermore the overall dimensions can be reconfigured to fit larger dimension walls. These two interlocking sections contain 2 inch long permanently affixed rims 221A and 222A on all four sides of their outer edges that rest up against the block wall on both sides of the wall to insure anchorage. There is a hinged cover 225 affixed to the front of the metal box (i.e. the stairway side), which has a hinge 228 and can be readily opened with a 1620 key; a key required to be carried by firefighters at all times. The key is inserted into keyway 223 within this hinged front cover 225. A rear cover 220 located on the back side (i.e. the hallway side) also has a hinge 226 and is removable from within the metal box enclosure from the stairway side via an interior quick release latch 223A. Both hinged covers 220 and 225 are hinged to their respective fireproof boxes 222 and 221 at their lower edges permitting each of these covers to swing downward toward the floor when opened. A securing bracket 224 adjacent the hallway side supports the quick connect stream applicator 227 constructed of a fire resistant metal alloy and all attached components therein, which include items 202, 204, 204A, 207, 208, 209, 210, 210C, 210D, 211, 214 and 224 as shown in FIG. 3B.

The quick connect stream applicator device 227 and its surrounding construction is similar to device 100 described above. The quick connect stream applicator permits the nozzle of a fire hose to be quickly attached and detached. This securing bracket 224 is connected directly to the interior sides of the smaller metal box 222. Attached to bottom edge of securing bracket 224 is a fireproof blanket 224B of approximately 12×12 inches in size made of materials such as: silicone rubber glass fiber based cloth, ceramic fiber cloth, or Nomex Kevlar cloth. This fireproof blanket will have (2) approximately three-inch vertical cuts 224C spaced at four-inch intervals on the bottom edge of the blanket making for a better seal when fires hoses are inserted through the stairway box on the rollers. Fireproof blanket 224B will block smoke and heated fire gases that are present in the hallway from infiltrating into the stairway. The quick connect stream applicator assembly 227 will accept the main stream tip that is attached to the control nozzle (as seen in and previously disclosed in the first embodiment above and FIG. 1A, item 113) and permits free movement of the control nozzle handle 113D from the water full off position to the water full on position after being attached to the quick connect stream applicator within the box.

Upon access to the box via the stairway side cover, heat sensor 211 will be visible within the evacuation assist box and will release (i.e. pop out) for heat conditions preferably in excess of 150 degrees Fahrenheit or any other threshold temperature so desired is reached on the interior hall side of this box. That is, the heat sensor operates in a manner similar to that of the first embodiment described above. Also present within the lower portion of this metal box 222 as seen in FIGS. 3A and 3C is a metal hose roller 229, which is preferably 2 inches in diameter and the approximate width of the metal box. Metal hose roller 229 is divided into (3) approximately four-inch sections 229B capable of rotating independently of each other on the internal roller shaft giving firefighters the ability to use multiple hose lines to extinguish the fire.

The operation of device 227 in the stairway evacuation assist box will now briefly be described during use. First, firefighters will confirm or verify that there is a fire in a building equipped with fireproof door(s) separating the fire tower or public hall stairway from the interior public hallway and that there is a possibility of either firefighters or civilians being present on the stairway above the fire floor. Depending on heat conditions in the area of the stairway evacuation assist box, firefighters will recognize the floor level of the fire by means of the heat sensor contained therein as described in the first embodiment above. In addition and if possible, the firefighters will next assess the amount of smoke and heat present within the interior hall by quickly opening this fireproof door and then closing it to limit the amount of smoke and heat entering the stairway to the greatest degree possible.

Once it is confirmed that there is a significant amount of heat and smoke within the interior hall that is likely to hamper the safe egress of the occupants descending the public hall stairs, the first arriving engine company will open the front hinged cover 225 on the metal box by inserting a 1620 key into the keyway 223 of the locking mechanism. From the stairway side, they will then release the rear hinged cover 220 on the metal box 222 with the quick release latch 223A located on the inside top portion of the box and cover, insert the main stream nozzle tip 113 (that is attached to the controlling nozzle 113C) into the quick connect stream applicator 227 causing it to move forward and to then return to its original position.

Once the decision to start water is made, the control handle on the nozzle will be opened and the back pressure from the operation of the hose stream will cause the movable connection body nozzle guide/stop 210 and attached high heat resistant rubber seal 210C with the inner slide sleeve 210D as seen in FIG. 3B to be physically forced backward off the outer surface of inward socket guide/stop 214 permitting the forward nozzle stop bevel 204A to rest unimpeded on the inwardly rounded or slightly tapered edge of the inward socket guide/stop 214 allowing the connection to operate similar to that of a conventional ball and socket. During operation, the locking pins, locking balls or locking rings 207 will engage behind the main stream nozzle tip collar 113A (not shown in FIG. 3B) securing the main stream-tip in place. Additionally, the spring release mechanism with knurled locking collar 208 is visible around the perimeter of the quick connect inner assembly. That is, the hose nozzle to quick connect stream applicator connection and operation is the same as that described in the first embodiment and as seen in FIG. 1B. Also identical to the first embodiment, the nozzle connection to the quick connection stream applicator allows the connection to operate similar to that of a conventional ball and socket with the entire structure allowing for movement of 12 degrees in all directions. The nozzle will then be opened discharging water directly into the interior hall to extinguish fire in the immediate vicinity. After extinguishing the fire in the hallway and the decision has been made to bring the hose line into said hallway to either extinguish the remaining fire therein or to advance the hose line toward the main fire area. The water supply can then be shut down and the main stream nozzle tip 113 can then be removed from the quick connect stream applicator. The firefighter will then depress the spring release mechanism 208 with knurled locking collar located on both sides of the main stream nozzle tip 113 from the stairway side with his thumb and index finger of one hand and push the locking collar 208 forward. This will permit the release of the locking pins, locking balls or locking rings 207 from the main stream nozzle tip collar 113A and the removal of the main stream nozzle tip 113 from the stairway metal box using the other hand. The hose line can then be retracted and passed over hose roller 229 located in the lower part of this stairway evacuation assist box. Firefighters can then quickly enter the interior hall via the door separating the fire tower or public hall stairway from the interior hall and close said door behind them thereby limiting the amount of smoke and heat from entering into the public stairway. This is especially critical in cases of wind driven fires that are known to create blowtorch type heat conditions in the hallways. Once in the interior hallway, firefighters can then retrieve and operate the hose line that was passed through the stairway evacuation assist box moving toward the seat of the fire.

The hose roller 229 will provide a mechanical advantage to firefighters who are pulling the hose through the stairway evacuation assist box. A second hose line can then be passed over the same hose roller 229 with (3) independent rotating sections 229B facilitating the stretching of a second hose line, if needed, while maintaining the door separating the fire tower/stairway from the interior hall in a closed position until assured that no one is present on the stairway whose safety would be compromised.

Figure 3D:
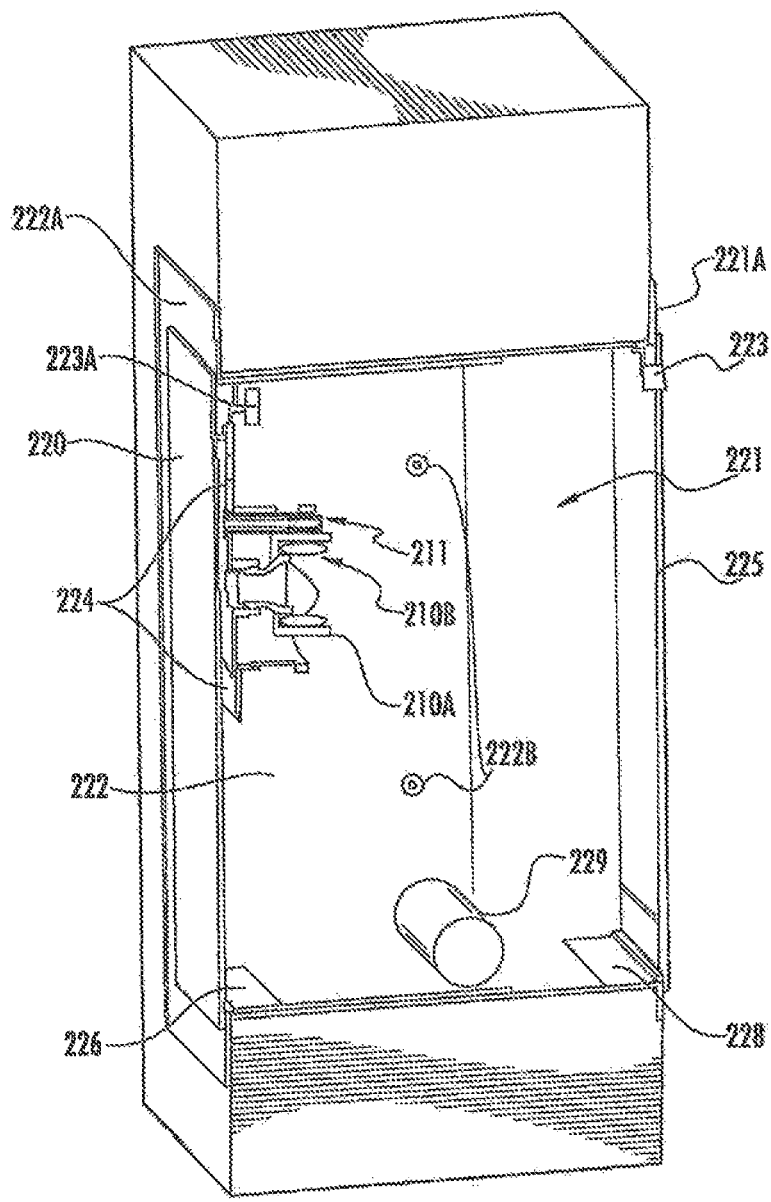

FIG. 3D generally shows device 227 in a fire proof metal box of the second embodiment with a different construction comprising a high heat resistant rubber guide/stop instead of locking pins, locking balls or locking rings. This embodiment consists of a preferred 12 inch by 18 inch by 6 inch rectangular metal fireproof box 221 into which a smaller metal box 222 is inserted and nested. These two metal box halves are then joined together at their sides with ½ inch machine screws 222B within a cinder block wall opening. During installation of the stairway device, metal hallway box 222 is inserted into the larger metal stairway box 221 and as the boxes slide directly into one another and overlap they can be adjusted to fit into walls with dimensions from 6 to 10 inches in thickness before being attached together with screws 222B. Furthermore the overall dimensions can be reconfigured to fit larger dimension walls. These two interlocking sections contain 2 inch permanently affixed rims 221A and 222A on all four sides of their outer edges that rest up against the block wall on both sides of the wall to insure anchorage. There is a hinged cover 225 affixed to the front of the metal box (i.e. the stairway side), which is hinged 228 that can be readily opened with a 1620 key. The key is inserted into keyway 223 within this hinged front cover 225. A rear cover 220 located on the back side (i.e. the hallway side) is also hinged 226 and removable from within the metal box enclosure from the stairway side via an interior quick release latch 223A. Both hinged covers 220 and 225 are hinged to their respective fireproof boxes 222 and 221 at their lower edges permitting each of these covers to swing downward toward the floor when opened. Securing bracket 224 located adjacent to the hallway side supports suspended rapid placement assembly 210A constructed of a fire resistant metal alloy with attached high heat resistant rubber guide/stop 210B contained therein as shown in FIG. 3B. The internal housing assembly and associated nozzle guide/stop permits the nozzle of a fire hose to be quickly inserted and readily removed. This securing bracket 224 is connected directly to the interior sides of the smaller metal box 222.

Internal rapid placement housing assembly 210A will accept the nozzle on a typical fire hose and permits free movement of the nozzle control handle from the full off to the full on position while being operated within the box. Upon access to the box via the stairway side cover, heat sensor 211 will be visible within the evacuation assist box and will release (i.e. pop out) for heat conditions preferably in excess of 150 degrees or any other threshold temperature so desired is reached on the interior hall side of this box. That is, the heat sensor operates in a manner similar to that of the first embodiment described above. Also present within the lower portion of this metal box 222 is a metal hose roller 229, which is preferably 2 inches in diameter and divided into three independent rotating sections 229B and spans the approximate width of the metal box.

The operation of the modified device 227 in the stairway evacuation assist box will now briefly be described. First, firefighters will confirm or verify that there is a fire in a building equipped with fireproof door(s) separating the fire tower/public stairway from the interior public hallway and that there is a possibility of either firefighters or civilians being present on the stairway above the fire floor. If possible and optionally, the firefighters will next assess the amount of smoke and heat present within the interior hall by quickly opening this fireproof door and then closing it to limit the amount of smoke and heat entering the stairway to the greatest degree possible.

Once it is confirmed that there is a significant amount of heat and smoke within the interior hall that is likely to hamper the safe egress of the occupants descending the public hall stairs, the first arriving engine company will open the front hinged cover 225 on the metal evacuation assist box by inserting a 1620 key into the keyway 223 of the locking mechanism. It should be noted that the use of the evacuation assist box is especially critical in cases of "wind driven fires" since fires of this type have been known to reach blowtorch proportions in the public hallway. From the stairway side, they will then release the rear hinged cover 220 on the metal box 222 with the quick release latch 223A located on the inside top portion of the box and cover, insert the nozzle tip 113 through the center opening of the high heat resistant rubber guide/stop 210B, which is compressed within the rapid placement internal housing assembly 210A and located around the interior circumference of this opening. The nozzle will rest on the high heat resistant rubber guide/stop and be in contact with it around its entire circumference permitting directional support, but in no way impede or hinder the quick removal of the nozzle, if necessary.

Once the decision to start water is made, the nozzle will be opened and the stream directed to a maximum angle of approximately 60 degrees above or below the horizontal in a 360 degree radius thus permitting the hose stream to hit either the floor or ceiling within approximately 4 feet of the access box in which it is operated. Once a decision is made to remove the nozzle, the water supply is shut down. The firefighter will simply retract the nozzle pulling it backward through the rubber guide. Once the hose line is shut down it can then be passed over hose roller 229 located in the lower part of this metal box and firefighters can then quickly enter the interior hall via the door separating the fire tower from the interior hall and close said door behind them limiting the amount of smoke and heat in the public hall stairway, and then retrieve and operate the hose line that was passed through the metal box moving toward the seat of the fire.

The hose roller 229 will provide a mechanical advantage to firefighters who are pulling the hose through the stairway evacuation assist box. A second or third hose line can then be passed over an adjacent hose roller section 229B facilitating the stretching of the second or third hose line, if needed, while maintaining the door separating the fire tower from the interior hall in a closed position until assured that no one is present on the stairway whose safety would be compromised.

Firefighters engaged in firefighting operations when entering or exiting the fire floor in buildings equipped with this type of device shall, to the greatest degree possible, maintain the door separating the fire tower from interior hall in a closed position to ensure the safety of those present or likely to enter the attack stairway above the fire floor. This is especially critical in cases of a "wind driven fire" as described above.

Figure 4A:
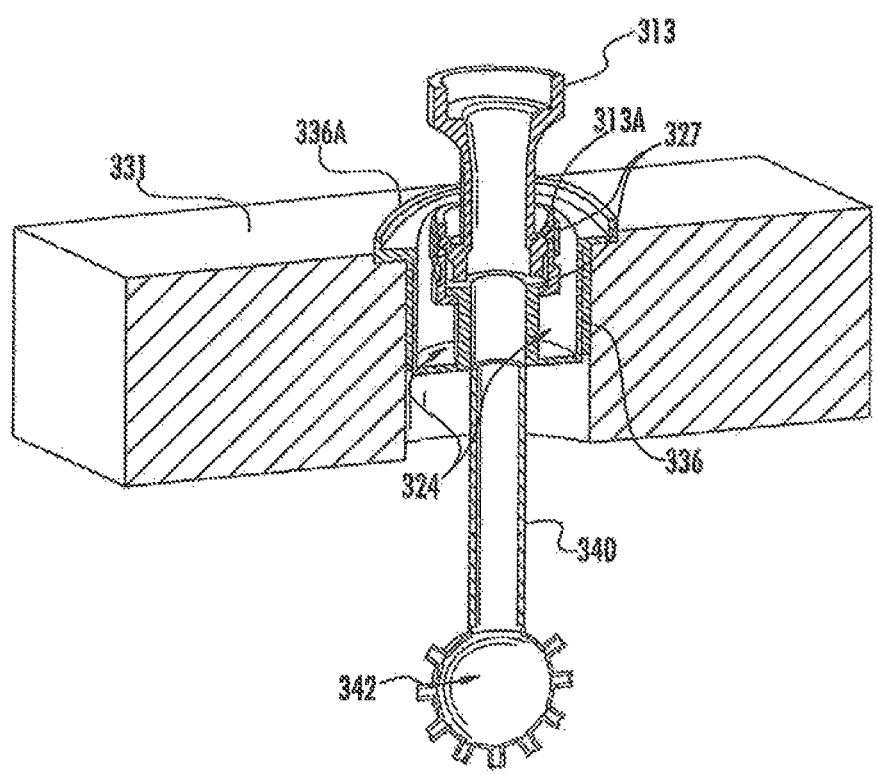
FIGS. 4A-4C generally depict the installation of the quick connect stream applicator device on the roof of either a non-fireproof or fireproof building according to the third embodiment.
Figure 4B:
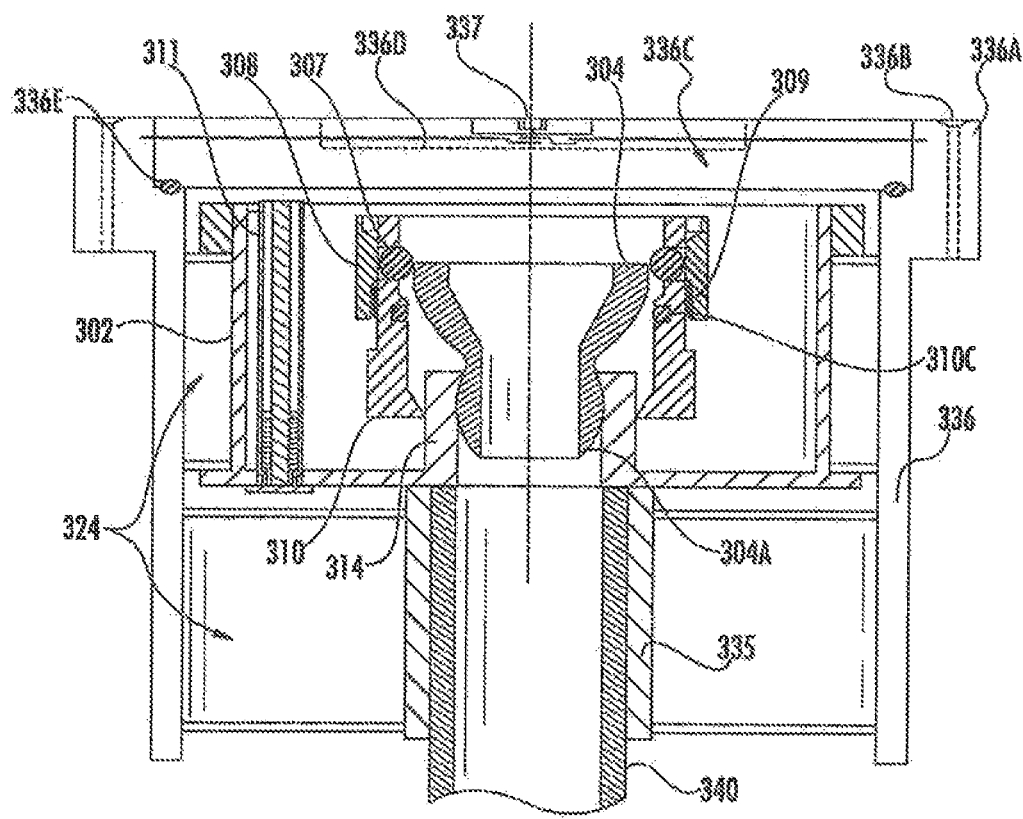

FIGS. 4A and 4B generally show the device 100 disposed in a roof according to a third embodiment (i.e. RAC device-Roof). The installation of this third embodiment will now briefly be described. An approximate 6 inch hole is drilled in the roof between roof joists. Cylindrical metal housing waterway 336 measuring preferably 6 inches in diameter with an attached preferable 2 inch roof flange 336A containing a fixed quick connect stream applicator constructed of a fire resistant metal alloy 327 and all attached components therein, which include items 302, 304, 304A, 307, 308, 309, 310, 310C, 311, 314, 324 and 337 as shown in FIG. 4B. This cylindrical metal housing 336 is inserted into the roof opening until roof flange 336A is seated firmly on the roof surface. Securing bracket 324 is an integral part of the cylindrical metal housing 336 and is the means by which the quick connect stream applicator 327 is permanently attached to the inner walls of housing 336. The lower portion of the securing bracket 324 contains an inside pipe thread 335 measuring preferably 2 inches in diameter that accepts threaded stem pipe extension 340 of variable lengths (e.g. depending on the depth of the space between the roof and the top floor ceiling) to which metal stream director 541 as shown in FIG. 6B is affixed by means of a male thread at its end that permits connection into the lower portion of stem pipe extension 340. Stream director 541 will contain a number of orifices (e.g., 9 orifices) that permit stream disbursement at an approximate 360-degree angle within the cockloft (i.e. space below the roof boards and above the top floor ceiling). In lieu of stream director 541 as described above, a distributor 342 containing a similar male thread at its end can be screwed directly into the lower portion of stem pipe extension 340. This will permit the distributor to operate rotatably, mechanically and fluidly while allowing water to enter the pipe extension 340 and to exit the distributor 342 while it is spinning thus resulting in a uniform distribution of water in this concealed space. It should be noted that the overall dimensions of this embodiment can be modified for either or both functionality and or aesthetics.

Installation of this third embodiment further includes drilling ⅛ inch holes from the roof side through roof boards at the predrilled holes 336B located around the perimeter of roof flange 336A. Next, 4 one way screws of ¼ inch by 2¼ inch with retaining rubber washers are inserted through predrilled holes 336B in roof flange 336A and tightened until the flange is seated properly on the roof surface. Finally, a preferably lime green cover 336C having threads on its outer perimeter is screwed into roof flange 336A having corresponding mating threads on its inner surface along with attached high heat resistant O-ring 336E until the cover is tight and flush with the roof flange. This roof cover 336C will be flush with the roof flange 336A, water tight and finished with a lime green reflective type color to facilitate ready identification under fire conditions as seen in FIG. 4B. It is noted that other cover colors and methods of applying the color and finishes such as electroplating, immersion plating, ceramic coatings, chemical coatings and metallic coatings applied to the cover are within the scope of the embodiment, but a green colored cover is preferred because it is easily visible. This metal cover will contain a keyway 337 and two parallel indented slots 336D approximately two (2) inches apart on its top surface as seen in FIG. 4B.

In use, the firefighter will simply insert a 1620 key (typically carried by firefighters) into a keyway 337, turn the key counter clockwise ¼ turn and unlock cover 336C. Once the cover is unlocked the firefighter would then insert the fork end of a Halligan tool (also typically carried by firefighters) or similar tool into indented slots 336D on the surface of the lime green cover 336C and turn counter clockwise to remove the cover. Next, the main stream tip 313 is inserted into opening in the roof against pivoting ball joint nozzle stop 304. It is noted that this will result in a ½ inch downward movement of the main stream tip 313. At the same time, the main stream tip collar 313A will pass locking pins, locking balls or locking rings 307 and lock the nozzle in place. The spring release mechanism 308 with knurled locking collar is visible around the perimeter of the cylindrical metal housing 336. Next, the nozzle control handle will be opened and the back pressure from the operation of the hose stream will cause the movable connection body nozzle guide/stop 310 and attached high heat resistant rubber seal 310C to be physically forced backward off the outer surface of inward socket guide/stop 314 permitting the forward nozzle stop bevel 304A to rest unimpeded on the inwardly rounded or slightly tapered edge of the inward socket guide/stop 314 allowing the connection to operate similar to that of a conventional ball and socket (all similar to the first and second embodiments as described above).

During operation, the locking pins, locking balls or locking rings 307 will engage behind the main stream tip collar 313A securing the main stream-tip in place. Additionally, the spring release mechanism 308 with knurled locking collar is visible around the perimeter of the quick connect inner assembly. Unlike in the previous two embodiments, stem pipe 340 is fixedly attached via securing bracket 324 and covers the water exposing end of the quick connect stream assembly. The stem pipe 340 has a metal stream director 541 as shown in FIG. 6B attached thereto that will contain nine orifices that will permit stream disbursement at an approximate 360-degree angle within the cockloft. In lieu of the above stream director, a rotatably attached distributor 342 with a plurality of smaller distributing holes is provided to maximize water application. Distributor 342 is also in fluid communication with the stem pipe 340 allowing water to enter and further rotate the distributor 342. The net effect is a plurality of smaller, but high pressure streams of water disbursed within the attacked area in a rotating fashion.

Once a decision is made to remove the main stream tip 313 from the cylindrical metal housing in the roof, the water supply is shut down. Subsequently, the firefighter will depress the spring release mechanism 308 with knurled locking collar located on both sides of the main stream tip 313 with his thumb and index finger of one hand and push the locking collar 308 forward. This will permit the release of the locking pins, locking balls or locking rings 307 from the main stream tip collar 313A and the retraction of the main stream nozzle tip 313 from the cylindrical metal housing with the other hand.

It should be noted that for maximum effectiveness, stream director 541 as shown in FIG. 6B has to extend beneath the roof joists. Since the combined length of the waterway and attached stem pipe 340 is a function of the space between the underside of the roof boards and the top floor ceiling it is expected that their combined length may be in excess of 3 feet. Similar to the first and second embodiments and as previously noted, the nozzle connection to the quick connect stream applicator allows the connection to operate similar to that of a conventional ball and socket with the entire structure allowing for movement of up to 12 degrees in all directions. Since the nozzle is moveable in this embodiment to 12 degrees above and below the horizontal in all directions the direction of this solid water stream within the larger attached stem pipe 340 will have a notable advantage, which will permit this solid stream to be more accurately directed toward the angular holes in the stream director 541 and thus afford greater reach and control of the stream direction being sought. In those instances when a distributor 342 is used in lieu of stream director 541 the water pressure will cause the distributor to spin or rotate about the stem pipe extension 340 and the additional angular moment, will result in a powerful spinning hose stream that is disbursed in a circumference of approximately 25 feet within the space below the roof boards and above the top floor ceiling.

Figure 4C:
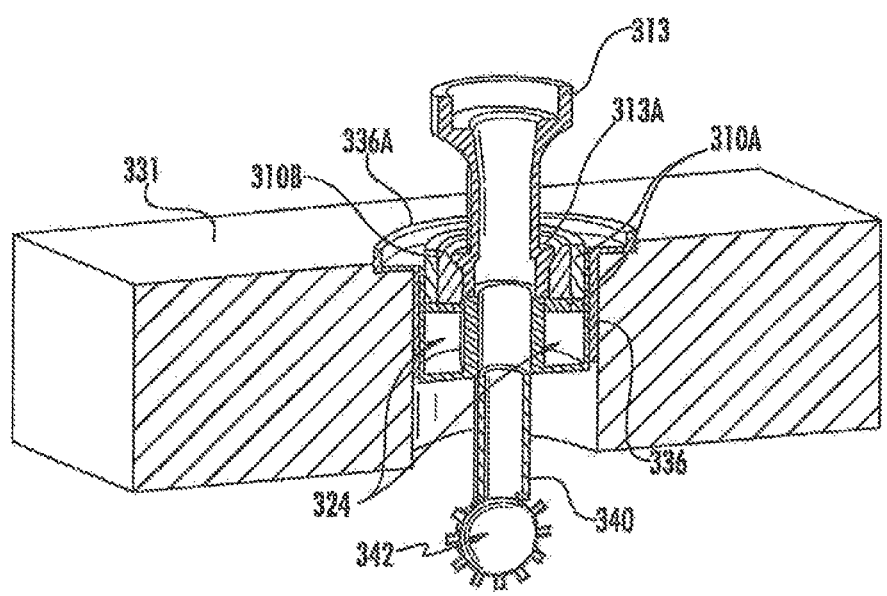

FIG. 4C generally shows the rapid placement stream applicator disposed in a roof according to the third embodiment with a different construction comprising a high heat resistant rubber guide/stop instead of locking pins, locking balls or locking rings 307. The installation of this variation of the third embodiment will briefly be described. An approximate 6 inch hole is drilled in the roof between roof joists. Waterway 336 measuring approximately 2 inches in diameter with an attached preferable 2 inch roof flange 336A constructed of a fire resistant metal alloy and all attached components therein, which include items 310A, 310B, and 324 as shown in FIG. 4C is inserted into the roof opening until roof flange 336A is seated firmly on the roof surface. The lower portion of waterway 336 contains an inside pipe thread 335 measuring preferably 2 inches in diameter that accepts a threaded stem pipe extension 340 of variable lengths (e.g. depending on the depth of the space between the roof and the top floor ceiling) to which metal stream director 541 as shown in FIG. 6B is affixed such as, for example, by means of a male thread at its end that permits connection into the lower portion of stem pipe extension 340. Stream director 541 will contain nine orifices that will permit stream disbursement at an approximate 360 degree angle within the cockloft (i.e. space below the roof boards and above the top floor ceiling). In lieu of stream director 541 as described above a distributor 342 containing a similar male thread at its end can be screwed directly into the lower portion of stem pipe extension 340. This will permit the distributor to operate rotatably, mechanically and fluidly while allowing water to enter the pipe extension 340 and to exit the distributor 342 while it is spinning resulting in an approximate 360 degree stream disbursement within this concealed space.

The installation of this variation of the third embodiment will also include drilling ⅛ inch holes from roof side through roof boards at the predrilled holes 336B located around the perimeter of roof flange 336A. Next, 4 one way screws of ¼ inch by 2¼ inch with retaining rubber washers are inserted through predrilled holes 336B in roof flange 336A and tightened until the flange is seated properly on the roof surface. Finally, a lime green cover 336C having threads on its outer perimeter is screwed into roof flange 336A having corresponding mating threads on its inner surface along with attached O-ring 336E until the cover is tight and flush with the roof flange. This roof cover 336C will be flush with the roof flange 336A, water tight and finished with a lime green reflective type color to facilitate ready identification under fire conditions as seen in FIG. 4B. It is noted that other cover colors and methods of applying the color and finishes to the cover are within the scope of the embodiment, but a green color cover is preferred because it is readily visible. This metal cover 336C will contain a keyway 337 and two parallel indented slots 336D approximately two (2) inches apart on its top surface as seen in FIG. 4B.

In use, the firefighter will simply insert a 1620 key (typically carried by firefighters) into a keyway 337, turn it counter clockwise ¼ turn and unlock the cover. Once the cover is unlocked the firefighter will then insert the fork end of a Halligan tool (typically carried by firefighters) or similar tool into indented slots 336D on the surface of the lime green roof cover 336C and turn counter clockwise to remove cover. Next, the nozzle 313 is inserted into the cylindrical metal housing 336 and through the center opening of high heat resistant rubber nozzle guide/stop 310B, which is compressed within internal housing assembly 336 and located around the interior circumference of this opening. The nozzle will rest on the high heat resistant rubber guide/stop 310B and be in contact with it around its entire circumference permitting directional support, but in no way impede or hinder the quick removal of the nozzle.

To remove the nozzle, the water supply is shut down and the nozzle simply retracted by pulling it backward through the high heat resistant rubber guide/stop 310B. Unlike in the previous discussed embodiments 1 and 2, stem pipe 340 is fixedly attached via waterway 336. Stem pipe 340 has a metal stream director 541 as shown in FIG. 6B attached thereto that will contain nine orifices that will permit stream disbursement at an approximate 360 degree angle within the cockloft. In lieu of the above stream director a rotatably attached distributor 342 with plurality of smaller distributing holes to maximize water application can be used. Distributor 342 is also in fluid communication with the stem pipe 340 allowing water to enter and further rotate the distributor 342. The net effect of this is a plurality of smaller, but high pressure streams of water disbursed within the concealed roof space in a rotating fashion. Once a decision is made to remove the nozzle 313 from the waterway housing in the roof, the water supply is shut down and nozzle simply withdrawn.

It should be noted that for maximum effectiveness, stream director 541 as shown in FIG. 6B or distributor 342 has to extend beneath the roof joists. Since the combined length of the waterway and attached stem pipe 340 is a function of the space between the underside of the roof boards and the top floor ceiling it is expected that their combined length may be in excess of 3 feet. Therefore the reach and direction of the water stream within the cockloft by this means will rest solely on the nozzle pressure and the size and shape of the orifices in either the stream director 541 or distributor 342, and not the position of the nozzle at roof level.

In those instances when a distributor 342 is used in lieu of stream director 541 the water pressure will cause the distributor to spin or rotate about the pipe extension 340 resulting in the disbursement of a powerful spinning hose stream in a circumference of approximately 25 feet within the space below the roof boards and above the top floor ceiling.

Figure 5A:
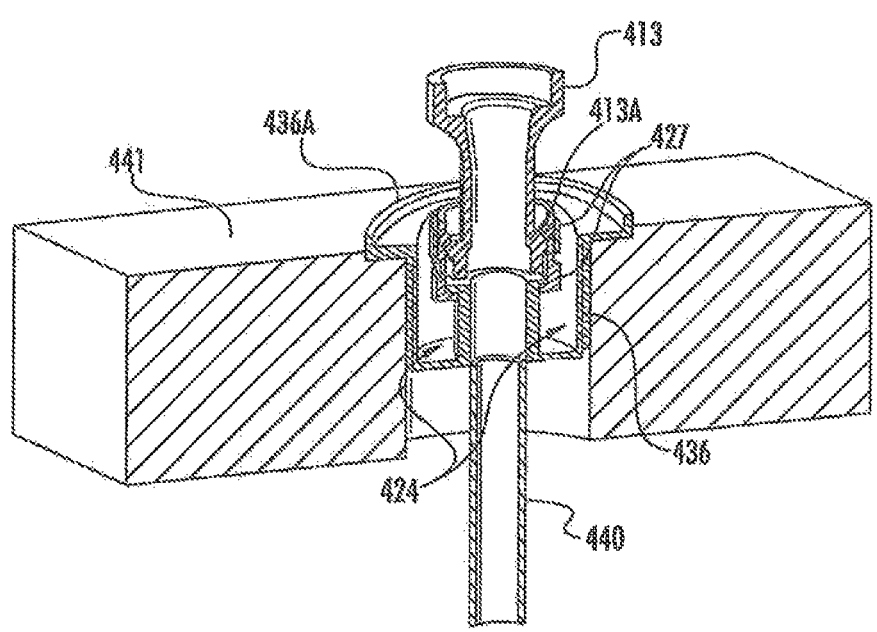
FIGS. 5A-5C generally depicts the installation of the quick connect stream applicator in a sidewalk or at street level above a subway platform or tunnel according to the fourth embodiment.
Figure 5B:
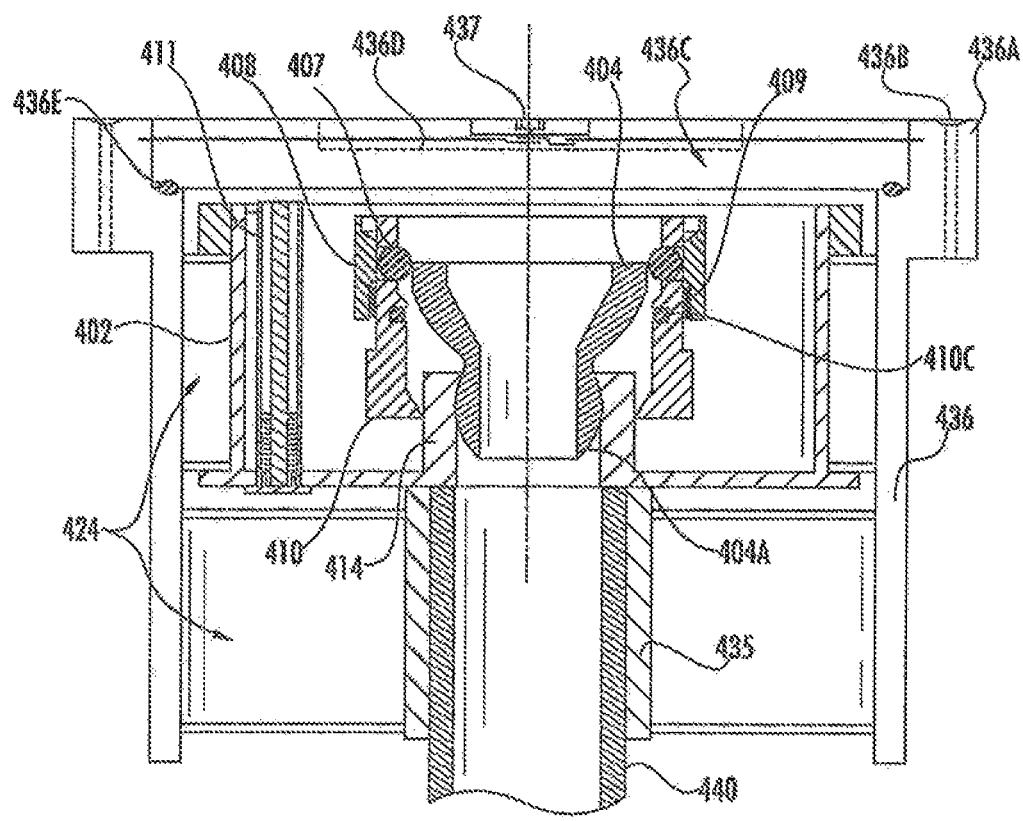

FIGS. 5A and 5B generally show a configuration for a sidewalk or street for a subway or tunnel application according to the fourth embodiment (i.e. RAC device-Subway). The installation of this fourth embodiment will now be described. An approximate 6 inch hole is drilled in the sidewalk or street above either a subway or tunnel. Cylindrical metal housing 436 measuring six (6) inches in diameter with an attached two (2) inch flange 436A containing a fixed quick connect stream applicator 427 constructed of a fire resistant metal alloy and all attached components therein, which include items 402, 404, 404A, 407, 408, 409, 410, 410C, 411, 414, 424 and 437 as shown in FIG. 5B. This cylindrical metal housing 436 is inserted into the sidewalk or street opening until the flange 436A is seated firmly on the sidewalk or street surface. Securing bracket 424 adjacent the street side is an integral part of the cylindrical metal housing 436 and is the means by which the quick connect stream applicator 427 is permanently attached to its inner walls. The lower portion of the securing bracket 424 contains an inside pipe thread 435 measuring approximately 2 inches in diameter that accepts a threaded stem pipe extension 440 of variable lengths (e.g. depending on the depth of the space between the sidewalk or street and the underside of subway or tunnel ceiling). Depending on the angle of stream penetration being sought, this stem pipe extension may contain optional metal stream director 541 as shown in FIG. 6B to facilitate maximum stream disbursement within the subway or tunnel. The installation of this fourth embodiment also includes drilling ¼ inch by 2¼ inch deep holes (e.g., 4 holes) from street side into the sidewalk or street at the predrilled holes 436B located around the perimeter of the flange 436A using the flange as a template. Next, the entire cylindrical metal housing is removed with the attached flange. Lead concrete shields or anchors are then inserted into the previously drilled holes. The cylindrical metal housing is then reinstalled lining up the holes in the flange with the lead concrete shields and then ¼ inch by 2¼ inch one way screws or bolts with rubber retaining washers are inserted through predrilled holes 436B in flange 436A and the screws tightened until the flange is seated properly on the sidewalk or street. Finally, a lime green cover 436C having threads on its outer perimeter is screwed into sidewalk flange 436A having corresponding mating threads on its inner surface along with attached high heat resistant O-ring 436E which is placed into the flange 436A. This cover will be flush with the flange, water tight and finished with a lime green reflective type color to facilitate ready identification under fire conditions.

Once again it is noted that other cover colors and methods of applying the color and finishes to the cover are within the scope of the embodiment, but a green color cover is preferred because it is readily visible. This metal cover will contain a keyway 437 and two parallel indented slots 436D approximately 2 inches apart on its top surface as seen in FIG. 5B. It should be noted that the overall dimensions of this embodiment can be modified for either or both functionality and or aesthetics.

A brief description of the operation of this fourth embodiment will now be provided. In use, firefighters will simply insert the appropriate subway emergency key that they carry into this keyway, turn it counter clockwise ¼ turn and unlock the cover. Once this cover is unlocked the firefighter will then insert the fork end of a Halligan tool (also typically carried) or similar tool into indented slots 436D on the surface of the lime green cover 436C and turn counter clockwise and remove the cover. Next, they will insert the main stream tip 413 into the opening in the street against pivoting ball joint nozzle stop 404. It should be noted that this will result in a ½ inch downward movement of the main stream tip 413. At the same time, the main stream tip collar 413A will pass locking pins, locking balls or locking rings 407 and lock the nozzle in place.

Once the decision to start water is made, the controlling handle 113D on the controlling nozzle 113C will be opened and the back pressure from the operation of the hose stream will cause the movable connection body nozzle guide/stop 410 and attached high heat resistant rubber seal 410C to be physically forced backward off the outer surface of inward socket guide/stop 414 permitting the forward nozzle stop bevel 404A to rest unimpeded on the inwardly rounded or slightly tapered edge of the inward socket guide/stop 414 allowing the connection to operate similar to that of a conventional ball and socket. During operation, the locking pins, locking balls or locking rings 407 will engage behind the main stream tip collar 413A securing the main stream-tip in place. Additionally, the spring release mechanism with knurled locking collar 408 is visible around the perimeter of the quick connect inner assembly. Like the previous third embodiment, stem pipe 440 is fixedly attached to the securing bracket 424 and covers the water exposing end of the quick connect assembly.

The stem pipe 440 has the capability of accepting optional metal stream director 541 as shown in FIG. 6B at its lower end, which is affixed thereto by means of a male thread and is equipped with nine orifices that will permit stream disbursement at an approximate 360 degree angle within the subway or tunnel. This stem pipe extension may be of variable diameters and lengths and may or may not contain optional stream director 541. In either case the available stem pipe opening or stream director openings will be sufficient to maintain a fresh air supply, air quality assessment and permit ventilation of the involved area. Since the nozzle is moveable in this embodiment to twelve (12) degrees above and below the horizontal in all directions the direction of this solid water stream within the larger attached stem pipe 440 will have a notable advantage, which will permit this solid stream to be more accurately directed toward the angular holes in the stream director 541 and thus afford greater reach and control of the stream direction being sought.

To remove the main stream tip 413 from the cylindrical metal housing in the street, the water supply will be shut down. The firefighter will then depress spring release mechanism with knurled locking collar 408 located on both sides of the main stream tip 413 with the thumb and index finger of one hand and push the locking collar 408 forward. This will permit the release of the locking pins, locking balls or locking rings 407 from the main stream tip collar 413A and the retraction of the main stream tip 413 from the cylindrical metal housing with the other hand.

Figure 2C:
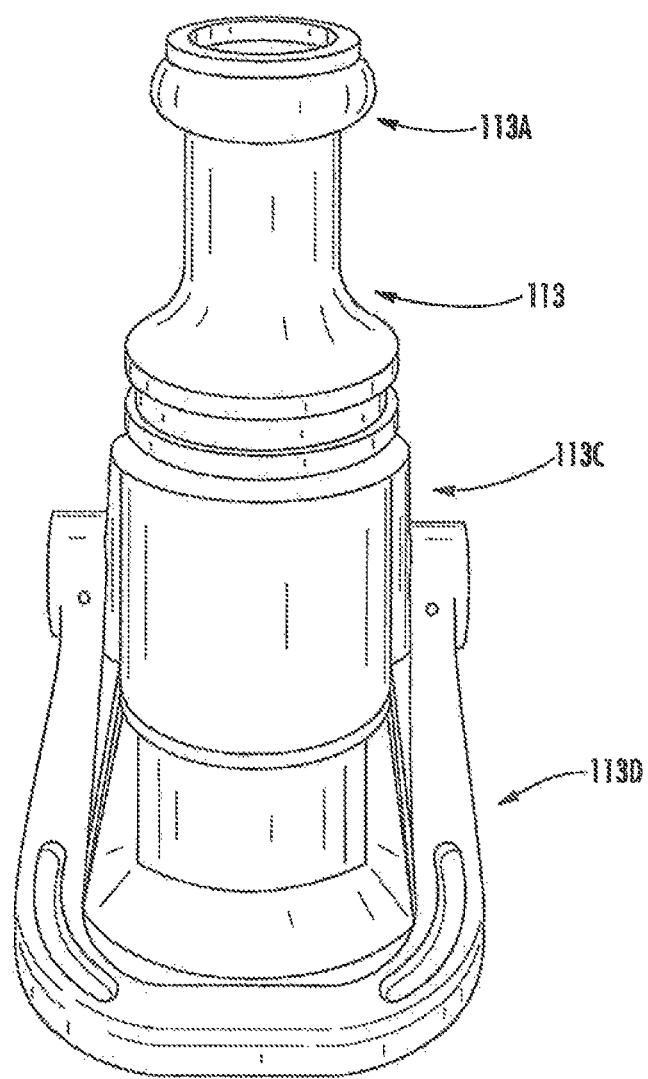
FIG. 2C is a perspective view of the fire control nozzle with nozzle tip attached.

If fire conditions are not apparent when sidewalk cover 436C is removed and prior to hose nozzle connection, an opening approximately two (2) inches in diameter will exist. This opening will permit: 1) the establishment of voice communications with those who may be trapped or incapacitated in the subway or tunnel below, 2) afford first responders the means by which they can obtain air samples in order to detect and identify the presence of chemical or biological agents therein and, 3) to provide a means by which first responders can introduce a fresh air supply into the subway station or tunnel, for the benefit of those individuals who may be trapped or incapacitated below and in need of fresh air. This device also facilitates ventilation of the involved area or space. This is possible in all of the embodiments since a tight seal is accomplished at the point of connection between the main stream nozzle tip 413 and the quick connect coupling's high heat resistant rubber seal 410C. With the main stream nozzle tip 413 attached to the controlling nozzle 113C as seen in FIG. 2C and inserted into the quick connect coupling in any of the device applications ventilation can be achieved. This is accomplished by attaching the female end of the pre-connected hose to a vacuum or external exhaust thereby minimizing unnecessary exposure to smoke, chemical agents and any other airborne pathogens.

Figure 5C:
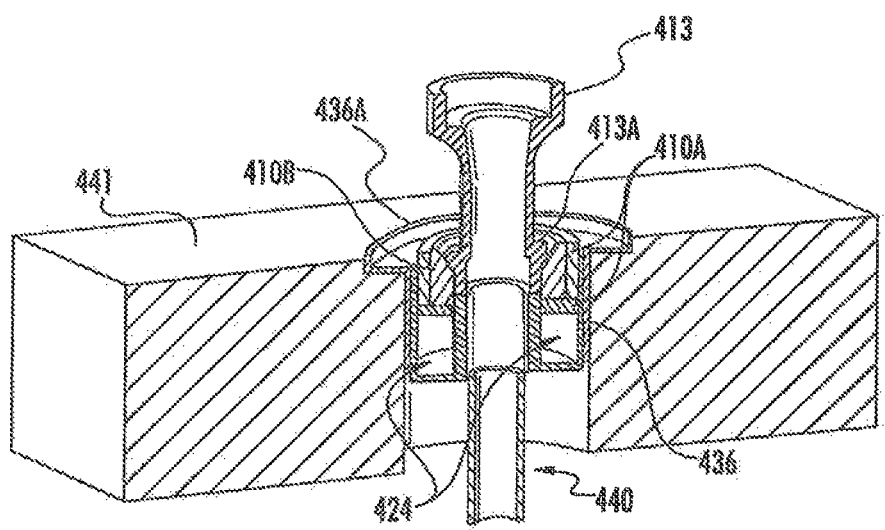

FIG. 5C generally shows a configuration for a sidewalk or street for a subway or tunnel application according to the fourth embodiment with a different construction comprising a high heat resistant rubber guide/stop instead of locking pins, locking balls or locking rings. The installation of the variation of this fourth embodiment will now be described. An approximate 6 inch hole is drilled in the sidewalk or street above either a subway or tunnel. Cylindrical metal housing 436 measuring 6 inches in diameter with an attached 2 inch flange 436A constructed of a fire resistant metal alloy and all attached components therein, which include items 402, 410A, 410B, 424, and 440 as shown in FIG. 5C. This cylindrical metal housing 436 is inserted into the sidewalk or street opening until the flange 436A is seated firmly on the sidewalk or street surface. Securing bracket 424 adjacent the street side is an integral part of the cylindrical metal housing 436. The lower portion of the securing bracket 424 contains an inside pipe thread 435 measuring approximately 2 inches in diameter that accepts a threaded stem pipe extension 440 of variable lengths (e.g. depending on the depth of the space between the sidewalk or street and the underside of subway or tunnel ceiling). Depending on the angle of stream penetration being sought, this stem pipe extension may contain optional metal stream director 541 as shown in FIG. 6B to facilitate maximum stream disbursement within the subway or tunnel.

The installation of the variation of this fourth embodiment also includes drilling ¼ inch by 2¼ inch deep holes from street side into the sidewalk or street at the predrilled holes 436B located around the perimeter of the flange 436A using the flange as a template. Next, the entire cylindrical metal housing is removed with attached flange. Lead concrete shields or anchors are then inserted into the previously drilled holes. The cylindrical metal housing is then reinstalled lining up the holes in the flange with the lead concrete shields and then ¼ inch by 2¼ inch one way screws or bolts with rubber retaining washers attached are inserted through predrilled holes 436B in flange 436A and the screws tightened until the flange is seated properly on the sidewalk or street. Finally, a lime green cover 436C having threads on its outer perimeter is screwed into sidewalk flange 436A having corresponding mating threads on its inner surface along with attached high heat resistant O-ring 436E is placed into the flange 436A. This cover will be flush with the flange, water tight and finished with a lime green reflective type color to facilitate ready identification under fire conditions.

Once again it is noted that other cover colors and methods of applying the color and finishes to the cover are within the scope of the embodiment, but a green color cover is preferred because it is readily visible. This metal cover will contain a keyway 437 and two parallel indented slots 436D approximately 2 inches apart on its top surface as seen in FIG. 5B.

A brief description of the operation of this variation of the fourth embodiment will now be provided. In use, firefighters will simply insert the appropriate subway emergency key that they carry into this keyway, turn it counter clockwise ¼ turn and unlock the cover. Once the cover is unlocked firefighters will then insert the fork end of a Halligan tool (also typically carried) or similar tool into indented slots 436D on the surface of the lime green cover 436C and turn counter clockwise and remove the cover. Next, they will insert the main stream tip 413 into the cylindrical metal housing 436 and through the center opening of high heat resistant rubber nozzle guide/stop 410B, which is compressed within internal housing assembly 436 and located around the interior circumference of this opening. The nozzle will rest on the high heat resistant rubber guide/stop 410B and be in contact with it around its entire circumference permitting directional support, but in no way impede or hinder the quick removal of the nozzle.

To remove the nozzle, the water supply is shut down. The firefighter will simply retract the nozzle pulling it backward through the high heat resistant rubber guide/stop 410B. Like the previous third embodiment, stem pipe 440 is fixedly attached to the securing bracket 424. The stem pipe 440 has the capability of accepting optional metal stream director 541 as shown in FIG. 6B at its lower end, which is affixed thereto by means of a male thread and is equipped with nine orifices that will permit stream disbursement at an approximate 360 degree angle within the subway or tunnel. This stem pipe extension may be of variable diameters and lengths and may or may not contain optional stream director 541. In either case the available stem pipe opening or stream director openings will be sufficient to maintain a fresh air supply, air quality assessment and permit ventilation of the involved area. Since the nozzle is moveable in this embodiment in all directions the direction of this solid water stream within the larger attached stem pipe 440 will have a notable advantage, which will permit this solid stream to be more accurately directed toward the angular holes in the stream director 541 and thus afford greater reach and control of the stream direction being sought.

If fire conditions are not apparent when sidewalk cover 436C is removed and prior to hose nozzle insertion, an opening approximately 2 inches in diameter will exist. This opening will permit: 1) the establishment of voice communications with those trapped or incapacitated in the subway or tunnel below, 2) the means by which first responders can obtain air samples in order to detect and identify the presence of chemical or biological agents therein and, 3) to provide a means by which first responders can introduce a fresh air supply into the subway station or, tunnel to the benefit of those individuals who may be trapped or incapacitated below and in need of fresh air.

Figure 6A:
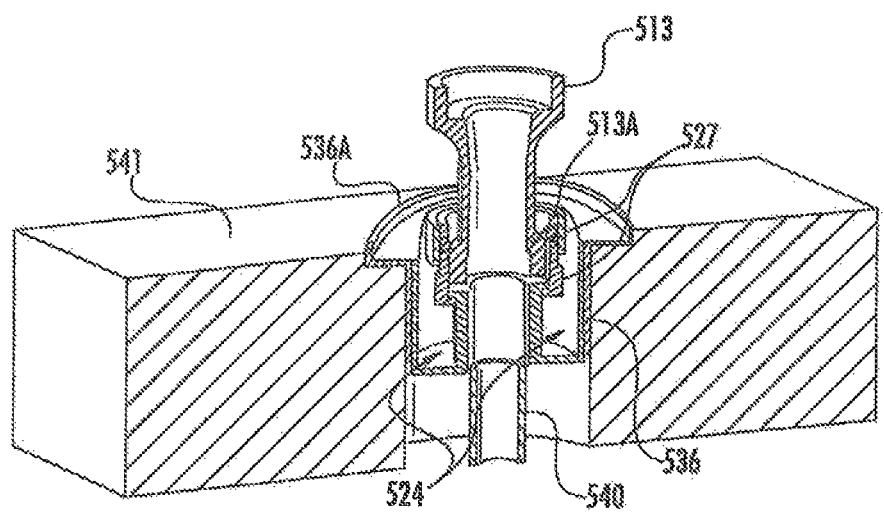
Figure 6B:
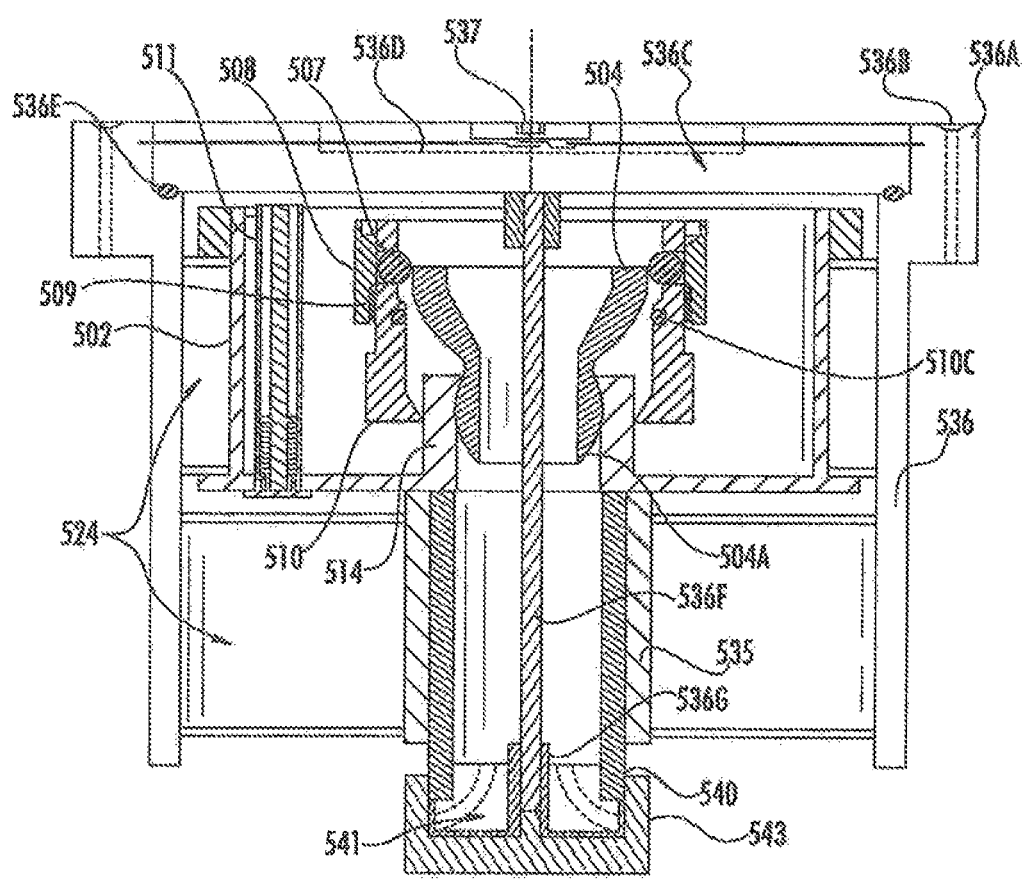

FIGS. 6A and 6B generally show a configuration for a wall or floor of a room or vessel according to the fifth embodiment (i.e. RAC device-Confined Space). The installation of this fifth embodiment will now be briefly described. A 6 inch hole is drilled in the wall or floor for the purpose of installation. Cylindrical metal housing 536 measuring 6 inches in diameter with an attached 2 inch flange 536A containing a fixed quick connect stream applicator 527 constructed of a fire resistant metal alloy and all attached components therein, which include items 502, 504, 504A, 507, 508, 509, 510, 510C, 511, 514, 524 and 537 as shown in FIG. 6B. This cylindrical metal housing 536 is inserted into the wall or floor until the flange 536A is seated firmly on the wall or floor surface. Securing bracket 524 adjacent the outside wall is an integral part of the cylindrical metal housing 536 and is the means by which the quick connect stream applicator 527 is permanently attached to its inner walls. The lower portion of the securing bracket 524 contains an inside pipe thread 535 measuring approximately 2 inches in diameter that accepts a threaded stem pipe extension 540 of variable lengths (e.g. depending on the depth of the wall or floor of the room or space to be protected). The lower portion of stem pipe extension 540 will contain an inside thread that will accept a compact, optional, metal stream director 541, which will contain a male thread at its end that permits attachment into the lower portion of stem pipe extension 540. Stream director 541 will contain nine orifices. The center orifice of the stream shaper will be in line with stem pipe extension 540 while the additional orifices will permit stream disbursement at an approximate 360 degree angle, respectively. It should be noted that the overall dimensions of this embodiment can be modified for either or both functionality and or aesthetics.

The installation of this fifth embodiment also includes drilling ¼ inch by 2¼ inch deep holes into the wall or floor from the exterior side at the predrilled holes 536B located around the perimeter of the flange 536A using the flange as a template. The entire cylindrical metal housing with attached flange is then removed and lead concrete shields or anchors are inserted into the previously drilled holes. It is noted that other types of wall anchors can be used to attach the flange to the wall, but shields or anchors are preferred. Next, the cylindrical metal housing is reinstalled lining up the predrilled holes in the flange with the lead concrete shields and then ¼ inch by 2¼ inch one way screws with rubber retaining washers are inserted through predrilled holes 536B in flange 536A and the screws tightened until the flange is seated properly on the wall or floor surface. Finally, a lime green cover 536C having threads on its outer perimeter is screwed into flange 536A having corresponding mating threads on its inner surface along with attached high heat resistant O-ring 536E is placed into the flange 536A. This cover will be flush with the flange and finished with a lime green reflective type color to facilitate ready identification under fire conditions as seen in FIG. 6B.

Once again it is noted that other cover colors and methods of applying the color and finishes to the cover are within the scope of the embodiment, but a green color is preferred because it is readily visible. This metal cover will contain a keyway 537 and two indented slots 536D approximately 2 inches apart on its top surface as seen in FIG. 6B. Permanently affixed to cover 536C is a brazed, hex shaped, ⅜ inch attachment rod 536F, which will extend completely through the approximate center of the threaded stem pipe extension 540 as well as the center orifice of metal stream director 541. The opposite end of attachment rod 536F will be screwed into a threaded, female coupling 536G that is brazed to the interior side of outer metal cover 543 just past the leading edge of the threaded pipe extension 540 or optional stream director 541. The outer metal cover 543 will be secure, water tight, decorative in appearance and flush with the interior wall surface or ceiling of the space being protected.

A brief description of the operation of this fifth embodiment will now be provided. In use, the firefighter will simply insert a 1620 key (typically carried by firefighters) into a keyway 537, turn it counter clockwise ¼ turn and unlock the cover. Once the cover is unlocked the firefighter will then insert the fork end of a Halligan tool (also typically carried) or similar tool into indented slots 536D on the surface of the lime green cover 536C and turn counter clockwise and remove cover 536C. Upon turning the lime green cover 536C counter clockwise with the fork end of the Halligan tool attachment rod 536F will back out of female coupling 536G that is brazed to the interior side of outer metal cover 543, thus permitting outer metal cover 543 to detach and fall to the floor. At the same time attachment rod 536F and lime green cover 536C will be removed from the opening in the wall or floor as a single unit. Next, the main stream tip 513 is inserted into opening in the wall or floor against pivoting ball joint nozzle stop 504. It should be noted that this will result in a ½ inch forward movement of the main stream tip 513. At the same time, the main stream tip collar 513A will pass locking pins, locking balls or locking rings 507 and lock the nozzle in place. Once the decision to start water is made, the control handle 113D on the controlling nozzle 113C will be opened and the back pressure from the operation of the hose stream will cause the movable connection body nozzle guide/stop 510 and attached high heat resistant rubber seal 510C to be physically forced backward off the outer surface of inward socket guide/stop 514 permitting the forward nozzle stop bevel 504A to rest unimpeded on the inwardly rounded or slightly tapered edge of the inward socket guide/stop 514 allowing the connection to operate similar to that of a conventional ball and socket as seen in FIG. 1C. The spring release mechanism 508 with knurled locking collar is visible around the perimeter of the cylindrical metal housing 536. As in the previous two embodiments, stem pipe 540 is fixedly attached to securing bracket 524 and covers the water exposing end of the quick connect device. However, it should be noted that since the nozzle is moveable in this embodiment to 12 degrees above and below the horizontal in all directions the direction of this solid water stream within the larger attached stem pipe 540 will have a notable advantage, which will permit this solid stream to be more accurately directed toward the angular holes in the stream director 541 and thus afford greater reach and control of the stream direction being sought. Upon retraction of the nozzle the stem pipe opening with or without optional attached metal stream director 541 will be sufficient to maintain a fresh air supply, air quality assessment, camera insertion and also permit limited ventilation of the involved area.

Once a decision is made to remove the main stream tip 513 from the cylindrical metal housing in the wall or floor the water supply is shut down. The firefighter will depress the spring release mechanism 508 with knurled locking collar located on both sides of the main stream tip 513 with the thumb and index finger of one hand and push the locking collar 508 forward. This will permit the release of the locking pins, locking balls or locking rings 507 from the main stream tip collar 513A and the retraction of the main stream tip 513 from the cylindrical metal housing with the other hand.

FIG. 6C generally shows a configuration for a wall or floor of a room or vessel according to the fifth embodiment with a variation in construction. In this instance comprising a high heat resistant rubber guide/stop 510B is used instead of locking pins, locking balls or locking rings are used. The installation of this variation of the fifth embodiment will be briefly described. A 6 inch hole is drilled in the wall or floor for the purpose of installation. Cylindrical metal housing 536 measuring 6 inches in diameter with an attached 2 inch flange constructed of a fire resistant metal alloy and all attached components therein, which include items 502, 510A, 510B, 524, 535, 536, 536A, 537 and 540 as shown in FIG. 6C. This cylindrical metal housing 536 is inserted into the wall or floor until the flange 536A is seated firmly on the wall or floor surface. Securing bracket 524 is an integral part of the cylindrical metal housing 536. The lower portion of the securing bracket 524 contains an inside pipe thread 535 measuring approximately 2 inches in diameter that accepts a threaded stem pipe extension 540 of variable lengths (e.g. depending on the thickness of the wall or floor of the room or space to be protected). The lower portion of stem pipe extension 540 will contain an inside thread that will accept a compact, optional, metal stream director 541, which will contain a male thread at its end that permits it to be screwed directly into the lower portion of stem pipe extension 540.

Stream director 541 will contain nine orifices. The center orifice of the stream director will be in line with stem pipe extension 540 while the additional orifices will permit stream disbursement at an approximate 360 degree angle respectively.

The installation of the variation of this fifth embodiment also includes drilling ¼ inch by 2¼ inch deep holes into the wall or floor from the exterior side at the predrilled holes 536B located around the perimeter of the flange 536A using the flange as a template. The entire cylindrical metal housing with attached flange is then removed and lead concrete shields or anchors are inserted into the previously drilled holes. It is noted that other types of wall anchors can be used to attach the flange to the wall, but shields or anchors are preferred. Next, the cylindrical metal housing is reinstalled lining up the predrilled holes in the flange with the lead concrete shields and then ¼ inch by 2¼ inch one way screws with rubber retaining washers attached are inserted through predrilled holes 536B in flange 536A and the screws tightened until the flange is seated properly on the wall or floor surface. Finally, a lime green cover 536C having threads on its outer perimeter is screwed into flange 536A having corresponding mating threads on its inner surface along with attached high heat resistant O-ring 536E which is placed into the flange 536A. This cover will be flush with the flange and finished with a lime green reflective type color to facilitate ready identification under fire conditions.

Once again it is noted that other cover colors and methods of applying the color and finishes to the cover are within the scope of the embodiment, but a green color cover is preferred because it is readily visible. This metal cover will contain a keyway 537 and two parallel indented slots 536D approximately 2 inches apart on its top surface. Also, permanently affixed to cover 536C is a brazed, hex shaped, ⅜ inch attachment rod 536F, which will extend completely through the approximate center of the threaded stem pipe extension 540 as well as the center orifice of metal stream director 541. The opposite end of attachment rod 536F will be screwed into a threaded, female coupling 536G that is brazed to the interior side of outer metal cover 543 just past the leading edge of the threaded pipe extension 540 or optional stream director 541. The outer metal cover 543 will be secure, water tight, decorative in appearance and flush with the interior wall surface or ceiling of the space being protected. A brief description of the operation of this fifth embodiment will now be provided.

In use, the firefighter will simply insert a 1620 key (typically carried by firefighters) into a keyway 537, turn it counter clockwise ¼ turn and unlock the cover. Once this cover is unlocked the firefighter will then insert the fork end of a Halligan tool (also typically carried by firefighters) or similar tool into indented slots 536D on the surface of the lime green cover 536C and turn counter clockwise and remove the cover. Upon turning the lime green cover 536C counter clockwise with the fork end of the Halligan tool attachment rod 536F will back out of female coupling 536G that is brazed to the interior side of outer metal cover 543, thus permitting outer metal cover 543 to detach and fall to the floor. At the same time attachment rod 536F and lime green cover 536C will be removed from the opening in the wall or floor as a single unit. Next, the main stream tip 513 is inserted into the opening in cylindrical metal housing 536 and then passed through the center opening of high heat resistant rubber nozzle guide/stop 510B. This high heat resistant rubber nozzle guide/stop is compressed within internal housing assembly 536 and located around the interior circumference of this opening. The nozzle will rest on the high heat resistant rubber guide/stop 510B and be in contact with it around its entire circumference permitting directional support, but in no way impede or hinder the quick removal of the nozzle. Once a decision is made to remove the nozzle, the water supply is shut down. The firefighter will simply retract the nozzle by pulling it backward through the high heat resistant rubber guide/stop 510B. As in the previous embodiments, stem pipe 540 is fixedly attached to securing bracket 524. However, it should be noted that since the nozzle is moveable in this embodiment in all directions the direction of this solid water stream within the larger attached stem pipe 540 will have a notable advantage, which will permit this solid stream to be more accurately directed toward the angular holes in the stream director 541 and thus afford greater reach and control of the stream direction being sought.

Upon retraction of the nozzle the stem pipe opening with or without optional attached metal stream director 541 will be sufficient to maintain a fresh air supply, air quality assessment, camera insertion and also permit ventilation of the involved area.

While various descriptions of the present invention are described above, it should be understood that the various features of each embodiment can be used singly or in any combination thereof. Therefore, this invention is not to be limited to only specifically preferred embodiments depicted herein. Additionally, it should be noted that the invention's overall dimensions can be modified and that component(s) within preferred embodiments can be changed, made optional or removed for functionality and operational efficiency. Further, it should be understood that variations and modifications within the spirit and scope of the invention may occur to those skilled in the art to which the invention pertains.

What is claimed is:

1. An access unit configured to be installed in a structural element of a structure to introduce firefighting fluid into an interior of the structure from an exterior of the structure, the access unit comprising:
   an outer housing configured to be inserted in an opening formed in the structural element from an exterior side, the outer housing comprising:
   a bracket attached to an interior side of the outer housing;
   an inner housing installed in the bracket, the inner housing comprising:
   a first face surrounded by a first flange and having an opening in a central portion of the first face, the opening being surrounded by a cylindrical socket extending from the first face in a first direction,
   a cylindrical body portion extending from the first face in the first direction, and
   a second face surrounded by a second flange and having an opening in a central portion of the second face, the second flange extending from an end of the body portion distal from the first face so that the first face, the second face, and the body portion define an interior of the inner housing; and
   a movable nozzle connector disposed within the interior of the inner housing, the nozzle connector having:
   a connection portion configured to receive an inserted fire hose nozzle in a coupling connection, and
   a cylindrical nozzle stop portion extending from the connection portion, the nozzle stop portion being movably coupled within an interior of the socket of the first face, wherein the bracket comprises a threaded portion at an inward end of the bracket for connecting an output pipe to the opening in the first face.

2. The access unit of claim 1, further comprising: the output pipe installed in the threaded portion at the inward end of the bracket; and a stream director attached to an inward end of the output pipe and having a plurality of output orifices.

3. The access unit of claim 1, wherein the socket of the first face has a concave interior surface and an inward end of the nozzle stop portion has a convex outer surface.

4. The access unit of claim 1, wherein the nozzle stop portion is configured to move rotatively and linearly within the interior of the socket of the first face.

5. The access unit of claim 1, wherein the connection portion of the nozzle connector comprises a seal configured to surround an end of an inserted nozzle.

6. The access unit of claim 1, wherein the connection portion of the nozzle connector comprises at least one of locking pins, locking balls, and locking rings configured to engage behind a collar of an inserted nozzle to form the locking connection.

7. The access unit of claim 6, wherein the connection portion comprises a spring release mechanism configured to release an inserted nozzle from the locking connection.

8. The access unit of claim 1, further comprising a heat sensor configured to provide an indication on an exterior side of the structural element that a temperature within the interior of the structure has exceeded a threshold.

9. The access unit of claim 5, wherein the seal comprises fire resistant rubber and has an opening through which the end of the inserted nozzle is received.

\* \* \* \* \*